United States Patent
Takaya et al.

(10) Patent No.: US 7,547,975 B2
(45) Date of Patent: Jun. 16, 2009

(54) MODULE WITH EMBEDDED SEMICONDUCTOR IC AND METHOD OF FABRICATING THE MODULE

(75) Inventors: Minoru Takaya, Tokyo (JP); Hisayuki Abe, Tokyo (JP); Kei Suzuki, Tokyo (JP); Kosuke Takano, Tokyo (JP); Kenichi Kawabata, Tokyo (JP); Toshikazu Endo, Tokyo (JP)

(73) Assignee: TDK Corporation, Tokyo (JP)

( * ) Notice: Subject to any disclaimer, the term of this patent is extended or adjusted under 35 U.S.C. 154(b) by 215 days.

(21) Appl. No.: 10/900,458

(22) Filed: Jul. 28, 2004

(65) Prior Publication Data

US 2005/0029642 A1 Feb. 10, 2005

(30) Foreign Application Priority Data

| Jul. 30, 2003 | (JP) | ............................. 2003-283243 |
| Jun. 29, 2004 | (JP) | ............................. 2004-191369 |
| Jun. 29, 2004 | (JP) | ............................. 2004-191475 |

(51) Int. Cl.
*H01L 23/48* (2006.01)
*H01L 23/52* (2006.01)
*H01L 29/40* (2006.01)

(52) U.S. Cl. ............... 257/778; 257/790; 257/E21.502; 257/E21.503

(58) Field of Classification Search ............... 257/778, 257/787, 788, 789, 790–795, 779–783, 786, 257/737–738, 785, 685, 686, 777, 723, 758, 257/724, E21.502, E21.503, E23.021, E23.116, 257/E21.508, E31.117

See application file for complete search history.

(56) References Cited

U.S. PATENT DOCUMENTS

| 4,926,239 A * | 5/1990 | Fujita et al. ................. 257/791 |
| 4,941,255 A | 7/1990 | Bull et al. ..................... 29/833 |
| 5,745,984 A | 5/1998 | Cole, Jr. et al. ............... 29/834 |

(Continued)

FOREIGN PATENT DOCUMENTS

EP 0 370 745 5/1990

(Continued)

OTHER PUBLICATIONS

Japanese Office Action received Feb. 13, 2007 and its excerpt translation in English.

(Continued)

*Primary Examiner*—A. Sefer
*Assistant Examiner*—Dilinh P Nguyen
(74) *Attorney, Agent, or Firm*—Wolff Law Offices, PLLC; Kevin A. Wolff

(57) ABSTRACT

A module with embedded semiconductor IC of the present invention includes a first resin layer, a second resin layer, post electrodes passing through the first and second resin layers, and a semiconductor IC mounted as embedded between the first resin layer and the second resin layer. Stud bumps are formed on land electrodes of the semiconductor IC and positioned with respect to the post electrodes. Owing to this positioning of the stud bumps formed on the semiconductor IC with respect to the post electrodes, the planar position of the stud bumps is substantially fixed. As a result, it is possible to use a semiconductor IC having a very narrow electrode pitch of 100 μm or smaller, particularly of around 60 μm.

25 Claims, 25 Drawing Sheets

U.S. PATENT DOCUMENTS

| | | | |
|---|---|---|---|
| 5,994,166 A * | 11/1999 | Akram et al. | 438/108 |
| 6,104,093 A * | 8/2000 | Caletka et al. | 257/778 |
| 6,136,668 A * | 10/2000 | Tamaki et al. | 438/462 |
| 6,175,157 B1 * | 1/2001 | Morifuji | 257/777 |
| 6,338,980 B1 | 1/2002 | Satoh | |
| 6,489,685 B2 | 12/2002 | Asahi et al. | 257/774 |
| 6,525,414 B2 * | 2/2003 | Shiraishi et al. | 257/686 |
| 6,555,924 B2 * | 4/2003 | Chai et al. | 257/788 |
| 6,582,991 B1 | 6/2003 | Maeda et al. | 438/107 |
| 6,753,483 B2 * | 6/2004 | Andoh et al. | 174/262 |
| 6,784,530 B2 * | 8/2004 | Sugaya et al. | 257/686 |
| 6,969,554 B2 * | 11/2005 | Kashiwagi et al. | 428/447 |
| 2001/0018242 A1 | 8/2001 | Kramer et al. | 438/200 |
| 2001/0036711 A1 | 11/2001 | Urushima | |
| 2002/0106893 A1 | 8/2002 | Furukawa et al. | 438/652 |
| 2003/0001283 A1 | 1/2003 | Kumamoto | |
| 2003/0013233 A1 | 1/2003 | Shibata | 438/114 |
| 2004/0178482 A1 | 9/2004 | Bolken et al. | |
| 2005/0142696 A1 | 6/2005 | Tsai | |
| 2006/0021791 A1 | 2/2006 | Sunohara et al. | 174/255 |

FOREIGN PATENT DOCUMENTS

| | | |
|---|---|---|
| EP | 1225629 A2 | 7/2002 |
| EP | 1503409 A2 | 2/2005 |
| FI | WO 03/065778 | 8/2003 |
| JP | 2529987 | 7/1989 |
| JP | 9-321408 | 12/1997 |
| JP | 09-321408 | 12/1997 |
| JP | 11-274241 | 10/1999 |
| JP | 2001-250902 | 9/2001 |
| JP | 2001-339165 | 12/2001 |
| JP | 2002-050874 | 2/2002 |
| JP | 2002-170840 | 6/2002 |
| JP | 2002-246500 | 8/2002 |
| JP | 2002-246507 | 8/2002 |
| JP | 2002-290051 | 12/2002 |
| JP | 2003-007896 | 1/2003 |
| JP | 2003-37205 | 2/2003 |
| JP | 2003-197655 | 7/2003 |
| JP | 2005-064470 | 3/2005 |

OTHER PUBLICATIONS

U.S. Appl. No. 11/527,829, filed Sep. 27, 2006, Kawabata et al.

European Search Report and Opinion dated Nov. 6, 2007 and attachments (9 pages).

Dibble E. P., et al: "Considerations for Flip Chip," Advance Packaging, IHS Publishing Group, US, vol. 6, No. 3, May 1997, pp. 28-30, XP000694608, ISSN: 1065-0555.

* cited by examiner

MODULE WITH EMBEDDED SEMICONDUCTOR IC AND METHOD OF FABRICATING THE MODULE

TECHNICAL FIELD

The present invention relates to a module with embedded semiconductor IC and a method of fabricating the module, particularly to a module with embedded semiconductor IC suitable for incorporating a semiconductor IC having a narrow electrode pitch and a method of fabricating the module.

BACKGROUND OF THE INVENTION

The desire to realize smaller and thinner modules mounted with semiconductor ICs has prompted numerous proposals regarding how to mount a bare semiconductor IC chip on a printed circuit board. A semiconductor IC in the bare-chip state has a very much narrower electrode pitch than a packaged semiconductor IC. When it is mounted on a printed circuit board, therefore, a need arises to address the important issue of how to bond the electrode pads of the semiconductor IC (sometimes called the "land electrodes" in the following description) with the wiring of the printed circuit board (sometimes called the "board wiring pattern").

One known method of bonding the land electrodes and board wiring pattern is wire bonding. Although this method enables relatively easy mounting of a bare-chip semiconductor IC, a problem arises in that the mounting area becomes large owing to the need to establish the region for mounting the semiconductor IC and the region for connecting the bonding wires on different surfaces of the printed circuit board.

Another method of connecting the land electrodes and board wiring pattern is that of mounting the bare-chip semiconductor IC by the flip-chip method. While this method reduces the mounting area, it involves complicated processing, such as applying multiple layers of under barrier metal (UBM) on the land electrodes in order to ensure adequate mechanical bonding strength between the land electrodes and board wiring pattern.

Moreover, both of these methods result in the semiconductor IC being mounted on the surface of the printed circuit board. The methods therefore have the common disadvantage of making it difficult to reduce the overall thickness of the module. Japanese Patent Application Laid Open No. 9-321408 ('408) teaches a method of fabricating a module with embedded semiconductor IC by forming a cavity in the printed circuit board and embedding a bare-chip semiconductor IC in the cavity.

When the method of '408 is adopted, however, the thickness of the printed circuit board needs to be increased to some degree so as to reinforce the strength of the region where the cavity is formed. This runs counter to the desire to make the module thinner. In addition, the size of the cavity in the planar direction has to be made somewhat larger than the size of the semiconductor IC in the planar direction. The resulting shift in the positional relationship between the land electrodes and board wiring pattern makes it very difficult to use a semiconductor IC having an electrode pitch of 100 μm or smaller.

Thus with the conventional module with embedded semiconductor IC, it is difficult to achieve sufficient thickness reduction and, further, very difficult to use a semiconductor IC having a narrow electrode pitch.

In the method taught by '408, most of the semiconductor IC is covered by the resin layer for filling the cavity. When a material excellent in physical properties is selected for the resin layer, the electrical properties are inadequate, and when a material excellent in electrical properties is selected, the physical properties are inadequate. In the conventional module with embedded semiconductor IC, it has therefore been hard to achieve both good semiconductor IC physical protection and excellent electrical properties at the same time.

SUMMARY OF THE INVENTION

It is therefore an object of the present invention to provide a module with embedded semiconductor IC enabling marked reduction in thickness, and a method of fabricating the module.

Another object of the present invention is to provide a module with embedded semiconductor IC capable of using a semiconductor IC having a very narrow electrode pitch, and a method of fabricating the module.

Still another object of the present invention is to provide a module with embedded semiconductor IC that achieves both good semiconductor IC physical protection and excellent electrical properties.

A module with embedded semiconductor IC according to one aspect of the present invention comprises a first resin layer, a second resin layer, post electrodes embedded in at least the first and second resin layers, and a semiconductor IC mounted as embedded between the first resin layer and the second resin layer, stud bumps being formed on land electrodes of the semiconductor IC and the stud bumps being positioned with respect to the post electrodes.

Since the semiconductor IC is embedded between the first resin layer and second resin layer in the present invention, the overall thickness of the module with embedded semiconductor IC can be reduced. Moreover, since the stud bumps formed on the semiconductor IC are positioned with respect to the post electrodes, the planar position of the stud bumps is substantially fixed. As a result, it is possible to use a semiconductor IC having a very narrow electrode pitch of 100 μm or smaller, particularly of around 60 μm. If a semiconductor IC reduced in thickness by polishing is used, the overall thickness of the module with embedded semiconductor IC can be made extremely thin.

Preferably, the module with embedded semiconductor IC of the present invention further comprises a first circuit board wiring pattern formed on the first resin layer side and a second circuit board wiring pattern formed on the second resin layer side, the post electrodes are electrically connected at their one ends to the first circuit board wiring pattern, and the post electrodes are electrically connected at their other ends to the second circuit board wiring pattern. This arrangement makes it possible to establish electrical connection between opposite surfaces of the module with embedded semiconductor IC. Moreover, a third circuit board wiring pattern is preferably formed to be embedded between the first resin layer and the second resin layer. This enables the module with embedded semiconductor IC to realize a complicated wiring pattern.

A module with embedded semiconductor IC according to another aspect of the present invention comprises a semiconductor IC formed on its main surface with stud bumps, a first resin layer formed in contact with a back surface and at least part of a peripheral surface of the semiconductor IC, and a second resin layer formed in at least partial contact with the stud bumps, the first resin layer and the second resin layer being formed of different materials.

In this aspect of the present invention, since the first resin layer and the second resin layer are formed of different materials, the material of each resin layer can be selected in accordance with the properties it requires. It is therefore possible to select a material that is better in physical protective properties with respect to the semiconductor IC as the material of the first resin layer and select a material that is better in electrical properties as the material of the second resin layer. This makes it possible to achieve both physical protection of the semiconductor IC and excellent electrical properties.

Specifically, the material forming the second resin layer preferably has a higher Q value than the material forming the first resin layer. Further, the material forming the second resin layer preferably has a lower dielectric constant than the material forming the first resin layer. When a material better in electrical properties is selected as the material forming the second resin layer in this manner, the semiconductor IC can handle very high frequency signals because the distributed capacity of the transmission lines is restrained.

The mechanical strength of the material forming the first resin layer is preferably higher than that of the material forming the second resin layer, the water absorption property of the material forming the first resin layer is preferably lower than that of the material forming the second resin layer, and the adhesive property with respect to the semiconductor IC of the material forming the first resin layer is preferably higher than that forming the second resin layer. When a material better in physical properties is selected as the material forming the first resin layer in this manner, mechanical breakage, corrosion, and detachment of the semiconductor IC can be effectively prevented to enhance the reliability of the module with embedded semiconductor IC.

In particular, it is preferable for substantially all of the back surface of the semiconductor IC to be in contact with the first resin layer, for substantially all of the main surface of the semiconductor IC to be in contact with the second resin layer, and for substantially all of the peripheral surface of the semiconductor IC to be in contact with the first resin layer. This makes it possible to achieve both physical protection of the semiconductor IC and excellent electrical properties on a high order, because the majority of the main surface of the semiconductor IC contacts the first resin layer and the stud bumps contact the second resin layer.

The method of fabricating the module with embedded semiconductor IC according to the present invention comprises: a step of forming post electrodes on a first transfer board; a step of forming first and second locating portions on a second transfer board, a step of provisionally attaching a semiconductor IC having stud bumps to the second transfer board while aligning the stud bumps with the first locating portions; and a step of using the first and second transfer boards to press-harden a resin while using the second locating portions and the post electrodes to align the first transfer board with the second transfer board.

According the method of the present invention, the position of the semiconductor IC stud bumps in the planar direction is substantially fixed with respect to the position of the post electrodes in the planar direction. Since this means that substantially no deviation occurs, it becomes possible to form a wiring pattern that connects with the stud bumps. As a result, it is possible to use a semiconductor IC having a very narrow electrode pitch of 100 µm or smaller, particularly of around 60 µm.

The method of the present invention preferably further comprises a step of reducing the thickness of the semiconductor IC by polishing its back surface before provisionally attaching the semiconductor IC to the second transfer board. This enables the overall thickness of the module with embedded semiconductor IC to be made very thin.

The method of the present invention preferably further comprises a step of forming the board wiring pattern on at least one of the first transfer board and the second transfer board. This enables the board wiring pattern to be formed simultaneously with the resin press-hardening step.

The method of the present invention preferably further comprises: a step following resin hardening of detaching the second transfer board to expose the post electrodes and stud bumps; a step of forming a resin layer covering the exposed post electrodes and stud bumps; a step of removing part of the resin layer to again expose the post electrodes and stud bumps; and a step of forming a board wiring pattern matched to the again exposed post electrodes and stud bumps. In this case, the position of the stud bumps in the planar direction and the position of the post electrodes in the planar direction are substantially fixed. Since this means that substantially no deviation occurs, it becomes possible to form the wiring pattern.

A multilayer substrate can be used as the first transfer board. In this case, the first transfer board need not be detached but can be used as it is as a part of the module with embedded semiconductor IC.

As explained in the foregoing, the present invention can provide a module with embedded semiconductor IC that utilizes a semiconductor IC with a very narrow electrode pitch. In addition, the present invention enables simultaneous achievement of both good semiconductor IC physical protection and excellent electrical properties.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
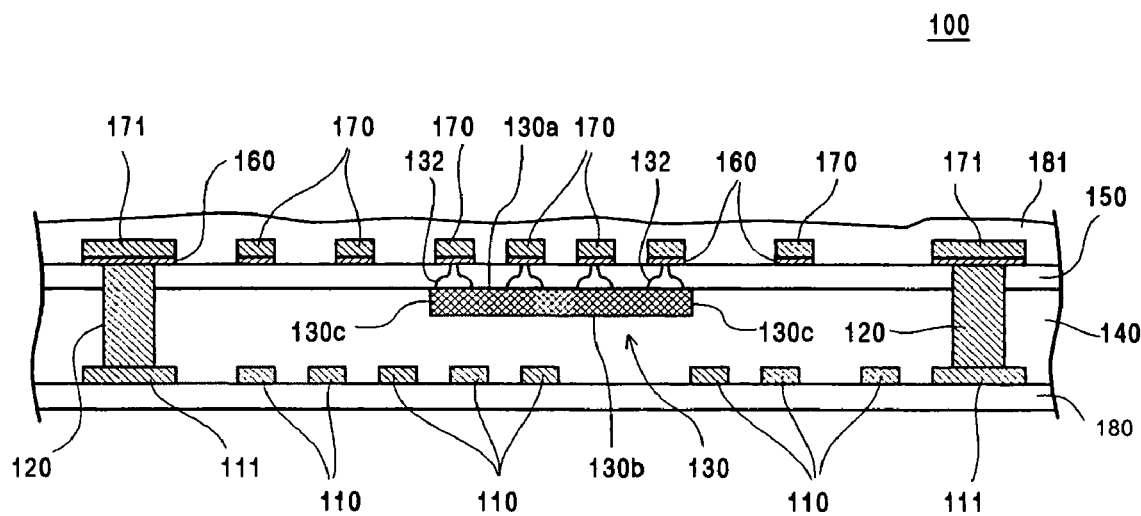
FIG. 1 is a schematic sectional view showing the structure of a module with embedded semiconductor IC 100 that is a preferred embodiment of the present invention.

FIG. 1 is a schematic sectional view showing the structure of a module with embedded semiconductor IC 100 that is a preferred embodiment of the present invention.

As shown in FIG. 1, the module with embedded semiconductor IC 100 of this embodiment has a laminated resin layer 140 (first resin layer) and resin layer 150 (second resin layer), a semiconductor IC 130 embedded between the resin layer 140 and resin layer 150, lower board wiring patterns 110, 111 (together constituting a first circuit board wiring pattern) formed as embedded in the surface of the resin layer 140, upper board wiring patterns 170, 171 (together constituting a second circuit board wiring pattern) formed on the surface of the resin layer 150, an under conductor layer 160 formed under the upper board wiring patterns 170, 171, post electrodes 120 formed as embedded in and passing through the resin layer 140 and resin layer 150 to electrically connect the lower board wiring pattern 111 and the upper board wiring pattern 171, a protective layer 180 covering the surface of the resin layer 140 and the lower board wiring patterns 110, 111, and a protective layer 181 covering the surface of the resin layer 150 and the upper board wiring patterns 170, 171. The land electrodes of the semiconductor IC 130 (not shown in FIG. 1) are formed thereon with stud bumps 132 and the land electrodes are electrically connected to the upper board wiring pattern 170 through the stud bumps 132. As shown in FIG. 1, the stud bumps 132 pass through the resin layer 150.

Although not shown in FIG. 1, capacitors and other such passive components are mounted on the surfaces of the protective layers 180, 181 and are electrically connected to the lower board wiring patterns 110, 111 or the upper board wiring patterns 170, 171 through via holes (BVH) formed in the protective layers 180, 181.

The semiconductor IC 130 incorporated in the module with embedded semiconductor IC 100 of this embodiment is one that has been reduced in thickness by polishing. As a result, the overall thickness of the module with embedded semiconductor IC 100 can be reduced to under 1 mm, e.g., to around 200 μm. Moreover, as explained in further detail later, the position of the semiconductor IC 130 stud bumps 132 in the planar direction is substantially fixed with respect to the position of the post electrodes 120 in the planar direction. Therefore, substantially no shift in the positional relationship between the stud bumps 132 and the upper board wiring pattern 170 occurs in the course of fabrication.

Figure 2:
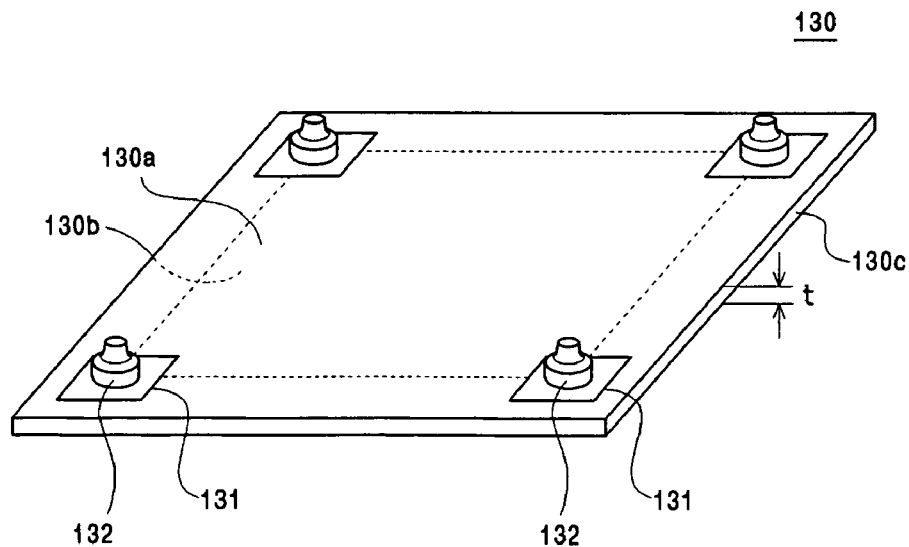
FIG. 2 is a schematic sectional view showing the structure of the semiconductor IC 100.

FIG. 2 is a schematic sectional view showing the structure of the semiconductor IC 130.

As shown in FIG. 2, the semiconductor IC 130 is a bare chip semiconductor IC whose main surface 130a is formed with numerous land electrodes 131 (only four shown) The pitch of the land electrodes 131 (electrode pitch) is not particularly specified but can be very fine owing to the fact that substantially no shift arises in the positional relationship between the land electrodes 131 and the upper board wiring pattern 170 in the module with embedded semiconductor IC 100 of this embodiment. Therefore, a semiconductor IC with a very narrow electrode pitch of 100 μm or smaller, for instance, 60 μm, can be used.

Moreover, the back surface 130b of the semiconductor IC 130 is polished to make the thickness t of the semiconductor IC 130 (distance from the main surface 130a to the back surface 130b) much thinner than the thickness of an ordinary semiconductor IC. Although the thickness t is not particularly specified, it is preferably set at 200 μm or less, for example, 20-50 μm. The polishing of the back surface 130b is preferably conducted simultaneously with respect to a large number of semiconductor ICs in the wafer state, followed by dicing for separating them into individual semiconductor ICs 130. When the dicing into the individual semiconductor ICs 130 is done before thickness reduction by polishing, the operation can be efficiently conducted by polishing the back surface 130b with the main surface 130a of the semiconductor IC 130 in a covered state.

Each land electrode 131 is formed with a stud bump 132. The size of the stud bumps 132 can be appropriately decided based on the electrode pitch. If the electrode pitch is about 100 μm, for example, it would be appropriate to set the stud bump diameter at 30-50 μm and height at 40-80 μm. The stud bumps 132 can be formed on the land electrodes 131 of the individual semiconductor ICs 130 after dicing by use of a wire bonder. While other possibilities also exist, the material used for the stud bumps 132 is preferably copper (Cu). Use of copper (Cu) as the material of the stud bumps 132 enhances reliability compared with the case of using gold (Au) because stronger bonding strength with the land electrodes 131 can be realized.

As shown in FIG. 1, in the module with embedded semiconductor IC 100 of this embodiment, the back surface 130b and peripheral surface 130c of the semiconductor IC 130 are in contact with the resin layer 140, while the main surface 130a of the semiconductor IC 130 is in contact with the resin layer 150. As a result, the majority of the surface area of the semiconductor IC 130 is in contact with the resin layer 140 and the stud bumps 132 are in contact with the resin layer 150.

The resin layer 140 and the resin layer 150 are preferably formed of different materials. Specifically, a material better in physical protective properties with respect to the semiconductor IC 130 is preferable as the resin layer 140 material and a material better in electrical properties is preferably selected as the resin layer 150 material.

Materials better in physical protective properties with respect to the semiconductor IC 130 are ones having high mechanical strength, low water absorption property and high adhesive property with respect to the semiconductor IC 130. Since, as set out in the foregoing, the resin layer 140 is in contact with the majority of the surface area of the semiconductor IC 130, selection of a material having such properties as the material of the resin layer 140 makes it possible to effectively protect the semiconductor IC 130 against mechanical breakage, corrosion, detachment and the like, and thus realize enhanced reliability. Materials meeting this description include, but are not limited to, epoxy resin, phenol resin and benzoxazine resin, any of these resins added with talc, calcium carbonate, magnesium carbonate, aluminum hydroxide, magnesium hydroxide, aluminum borate whiskers, potassium titanate fiber, glass flakes, glass fiber, tantalum nitride, aluminum nitride or the like, any of these resins added with a metal oxide powder containing at least one metal selected from the group composed of magnesium, silicon, titanium, zinc, calcium, strontium, zirconia, tin, niobium, samarium, bismuth, aluminum, lead, lanthanum, lithium and tantalum, any of these resins blended with a resin fiber such as aramid fiber or the like, and any of these resins impregnated with glass cloth, aramid fiber, non-woven fabric or the like. Although these materials offer excellent physical protection of the semiconductor IC 130, they are not so good in electrical properties. This is not a problem, however, because the resin layer 140 is not in contact with the stud bumps 132.

Although no specific range is set for the mechanical strength of the resin layer 140, it preferably has a bending strength of not less than 100 MPa, more preferably not less than 120 MPa. A resin layer 140 having a bending strength of this magnitude ensures effective protection of the semiconductor IC 130 against mechanical breakage, corrosion, detachment and the like, thus enhancing the reliability of the module with embedded semiconductor IC 100.

Although no specific range is set for the water absorption of the resin layer 140, the water absorption value of the resin layer 140 after a 24-hour accelerated test conducted at a temperature of 121° C. and relative humidity of 100% is preferably not greater than 1.0%, more preferably not greater than 0.6%. A resin layer 140 satisfying these values effectively restrains expansion of the resin layer 140, especially after reflow.

Although the adhesive property of the resin layer 140 with respect to semiconductor IC 130 is not particularly defined, the adhesive property is preferably of a level such that, in the fabrication process set out later, no visible bubbles remain at the interface between the resin layer 140 and semiconductor IC 130.

Materials better in electrical properties are ones having high Q value and ones having low dielectric constant. Since, as explained in the foregoing, the resin layer 150 makes contact with the stud bumps 132, selection of a material having such properties as the material for resin layer 150 makes it possible to restrain the distributed capacity of the transmission lines, thus enabling the semiconductor IC 130 to handle very high frequency signals. The dielectric constant of the resin layer 150 is preferably lower than that of the material better in mechanical protection of the semiconductor IC 130 by at least 0.2, more preferably by at least 0.5. The dielectric constant of epoxy resin, the material generally used in printed circuit boards, is around 4.5. If the dielectric constant of the resin layer 150 is 0.2 or more below this value, the distributed capacity can be lowered by around 5%, and if it is 0.5 or more lower, the distributed capacity can be reduced by around 10%. The Q value of the resin layer 150 is preferably 100 or greater, more preferably 300 or greater. When a coil is fabricated on a printed circuit board whose material has Q value below 100, the f-Q characteristic of the coil is markedly affected to the point that the coil cannot achieve an adequate Q value. When a coil having an especially high Q value is required, such as in a PA (power amplifier) or VCO (voltage-controlled oscillator), the Q value of the material needs to be 300 or greater, because at a lower value it is not possible to attain the generally required characteristics.

Materials meeting these requirements include, but are not limited to, poly(vinyl benzyl ether) compound resin, bismaleimdetriazine resin (BT resin), cyanate ester resin, epoxy+ activated ester curing resin, polyphenylene ether resin (polyphenylene oxide resin), curable polyolefin resin, benzocyclobutene resin, polyamide resin, aromatic liquid crystal polyester resin, polyphenylene sulfide resin, polyether amide resin, poly (etheretherketone) resin and fluororesin, any of these resins added with silica, talc, calcium carbonate, magnesium carbonate, aluminum hydroxide, magnesium hydroxide, aluminum borate whiskers, potassium titanate fiber, alumina glass flakes, glass fiber, tantalum nitride, aluminum nitride or the like, any of these resins added with a metal oxide powder containing at least one metal selected from the group composed of magnesium, silicon, titanium, zinc, calcium, strontium, zirconia, tin, niobium, samarium, aluminum, bismuth, lead, lanthanum, lithium and tantalum, any of these resins blended with a resin fiber such as aramid fiber or the like, and any of these resins impregnated with glass cloth, aramid fiber, non-woven fabric or the like. Although these materials offer excellent electrical properties, they are not so good in physical protection properties with respect to the semiconductor IC 130. This is not a problem, however, because the area of contact of the resin layer 150 with the semiconductor IC 130 is relatively small.

A method of fabricating the module with embedded semiconductor IC 100 shown in FIG. 1 will now be explained with reference to the drawings.

FIGS. 3 to 24 are process diagrams for explaining the method of fabricating the module with embedded semiconductor IC 100 shown in FIG. 1.

Figure 3:
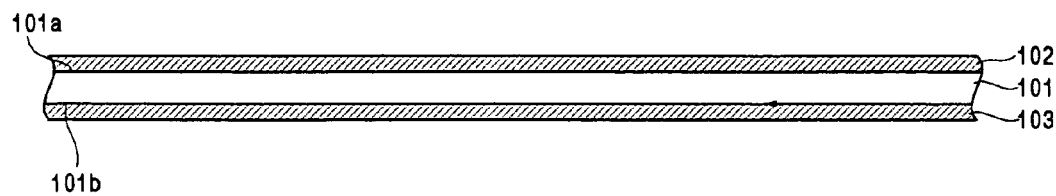
FIG. 3 is a diagram showing a part of the fabrication process of the module with embedded semiconductor IC 100 (formation of dry films 102 and 103).

First, a transfer board 101 (the first transfer board) is prepared and photosensitive dry films 102 and 103 are attached to the face 101a and underside 101b thereof (FIG. 3). The transfer board 101 can be made of any material that is electrically conductive. However, in view of the fact that it is peeled off in a later processing step, it is preferably made of a material having low adhesive property with respect to the resin layer 140 shown in FIG. 1. Materials that adhere weakly to resin include nickel (Ni) and stainless steel. The thickness of the transfer board 101 is not particularly defined except that it must be sufficient to ensure the mechanical strength it requires. A thickness of 50 μm is satisfactory, for example. The thickness of the dry film 102 must be made somewhat greater than that of the lower board wiring patterns 110 and 111. When the thickness of the lower board wiring patterns 110 and 111 are about 20 μm, for instance, the thickness of the dry film 102 should be made about 25 μm. As will be explained further later, the dry film 103 is provided for the purpose of preventing electroplating of the underside 101b of the transfer board 101 and can be of any desired thickness.

Figure 4:
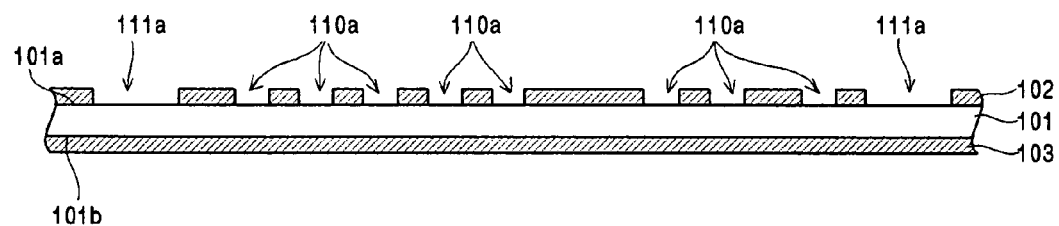
FIG. 4 is a diagram showing another part of the fabrication process of the module with embedded semiconductor IC 100 (patterning dry film 102).

Next, the dry film 102 is exposed using a photomask (not shown) and the dry film 102 is removed at the regions 110a and 111a where the lower board wiring patterns 110 and 111 are to be formed (FIG. 4). This exposes the face 101a of the transfer board 101 at the regions 110a and 111a. As the dry film 103 is not removed at this time, the underside 101b of the transfer board 101 remains covered substantially throughout.

Figure 5:
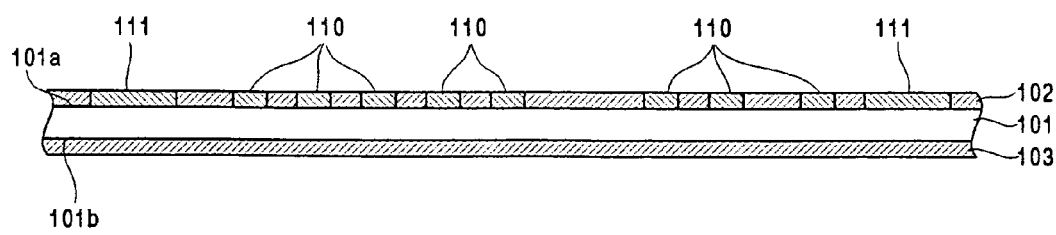
FIG. 5 is a diagram showing still another part of the fabrication process of the module with embedded semiconductor IC 100 (formation of lower board wiring patterns 110 and 111).
Figure 6:
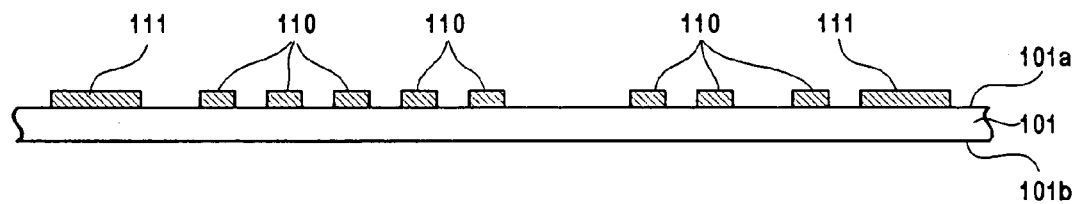
FIG. 6 is a diagram showing still another part of the fabrication process of the module with embedded semiconductor IC 100 (removing dry films 102 and 103).

After portions of the face 101a of the transfer board 101 have been removed in this manner, electroplating is conducted with the transfer board 101 as the substrate. This forms the lower board wiring patterns 110 and 111 at the exposed regions 110a and 111a, respectively, of the transfer board 101 (FIG. 5). The underside 101b of the transfer board 101 is not electroplated because it is substantially totally covered by the dry film 103. The type of plating solution can be appropriately selected in accordance with the desired material of the lower board wiring patterns 110 and 111. When the lower board wiring patterns 110 and 111 are to be made of copper (Cu), for example, copper sulfate can be used as the plating solution. The dry films 102 and 103 are then peeled off to obtain the transfer board 101 with the lower board wiring patterns 110 and 111 formed on its face 101a (FIG. 6).

Figure 7:
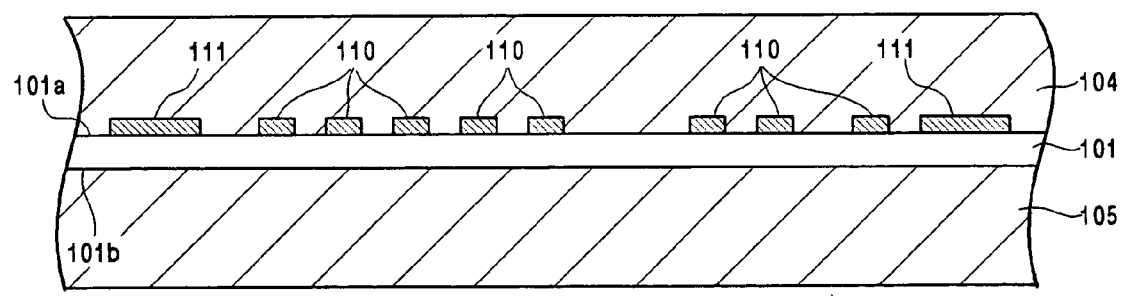
FIG. 7 is a diagram showing still another part of the fabrication process of the module with embedded semiconductor IC 100 (formation of dry films 104 and 105).

Next, another set of dry films 104 and 105 are attached to the face 101a and underside 101b of the transfer board 101 (FIG. 7). The thickness of the dry film 104 needs to be made somewhat thicker than that of the post electrodes 120. When the thickness of the post electrodes 120 is about 90 μm, for instance, the thickness of the dry film 104 should be made about 100 μm. Like the dry film 103, the dry film 105 is provided for the purpose of preventing electroplating of the underside 101b of the transfer board 101 and can be of any desired thickness.

Figure 8:
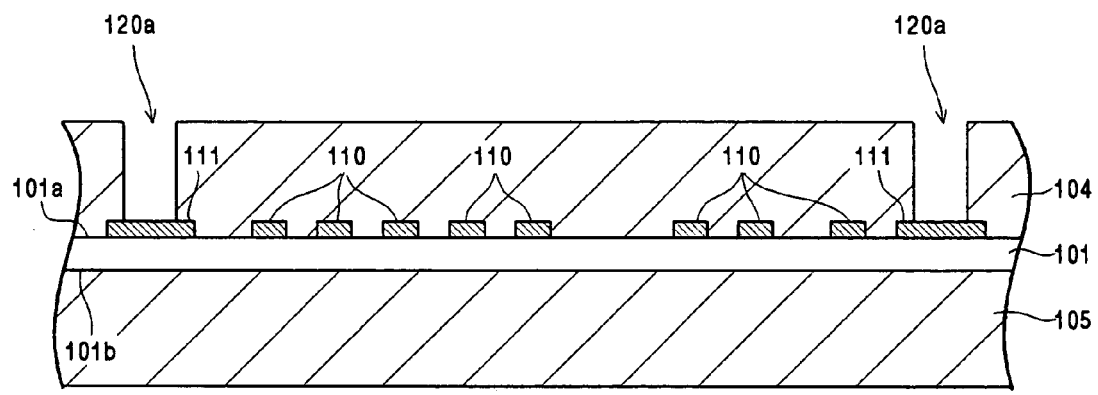
FIG. 8 is a diagram showing still another part of the fabrication process of the module with embedded semiconductor IC 100 (patterning dry film 104).

Next, the dry film 104 is exposed using a photomask (not shown) and the dry film 104 is removed at the regions 120a where the post electrodes 120 are to be formed (FIG. 8). As shown in FIG. 8, the regions 120a where the post electrodes 120 are to be formed are regions located at about the middle of the regions constituting the lower board wiring pattern 111.

This local exposure and removal of the dry film 104 exposes the lower board wiring pattern 111 at the regions 120a. As the dry film 105 is not removed at this time, the underside 101b of the transfer board 101 remains covered substantially throughout.

Figure 9:
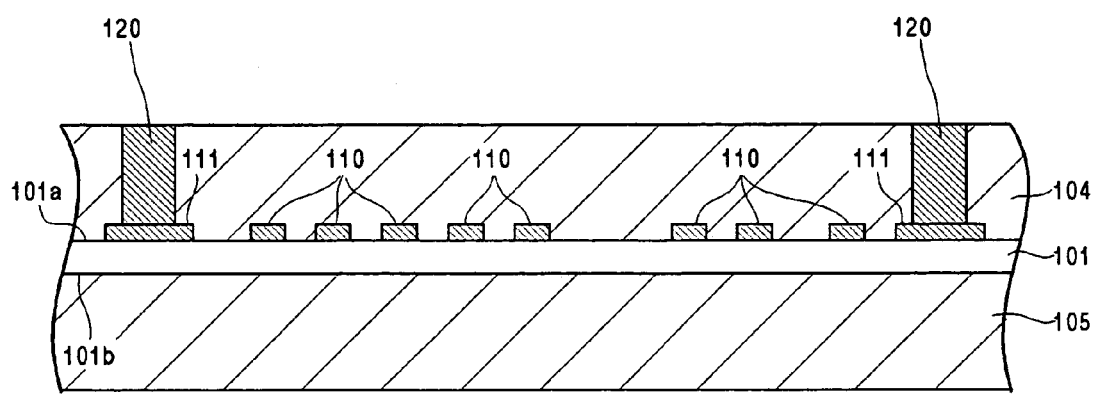
FIG. 9 is a diagram showing still another part of the fabrication process of the module with embedded semiconductor IC 100 (formation of post electrodes 120).
Figure 10:
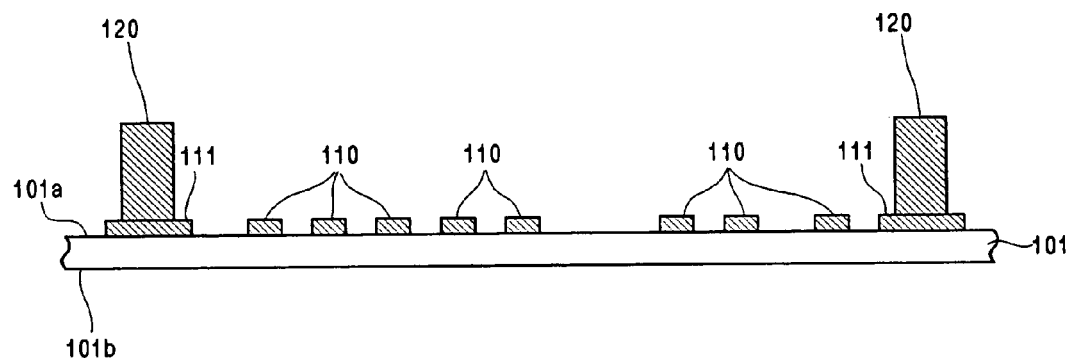
FIG. 10 is a diagram showing still another part of the fabrication process of the module with embedded semiconductor IC 100 (removing dry films 104 and 105).

After portions of the lower board wiring pattern 111 have been exposed in this manner, electroplating is conducted with the transfer board 101 as the substrate. This forms the post electrodes 120 at the exposed regions 120a of the lower board wiring pattern 111 (FIG. 9). The underside 101b of the transfer board 101 is not electroplated because its surface is substantially totally covered by the dry film 105. The type of plating solution used, which is selected as explained earlier, can be copper sulfate. The dry films 104 and 105 are then peeled off to obtain the transfer board 101 with the lower board wiring patterns 110, 111 and the post electrodes 120 formed on its face 101a (FIG. 10). This completes the processing of the transfer board 101.

Figure 11:
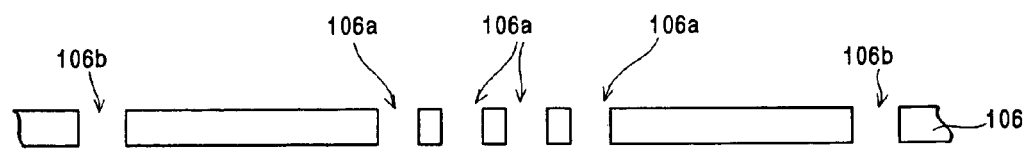
FIG. 11 is a diagram showing still another part of the fabrication process of the module with embedded semiconductor IC 100 (formation of locating holes 106a and 106b).

Next, another transfer board 106 (the second transfer board) is prepared separately of the transfer board 101 and etched at prescribed regions using an etching mask (not shown) to form locating holes 106a (the first locating portions) and locating holes 106b (the second locating portions) (FIG. 11). The transfer board 106 can be made of the same material and given the same thickness as the transfer board 101 but, differently from the transfer board 101, it is not required to be electrically conductive. In view of the fact that it is peeled off in a later processing step, however, it is preferably made of a material having low adhesive property with respect to the resin layer 140. When the transfer board 106 is made of the same material as the transfer board 101, the locating holes 106a, 106b can be formed by wet etching using ferric chloride.

Figure 12:
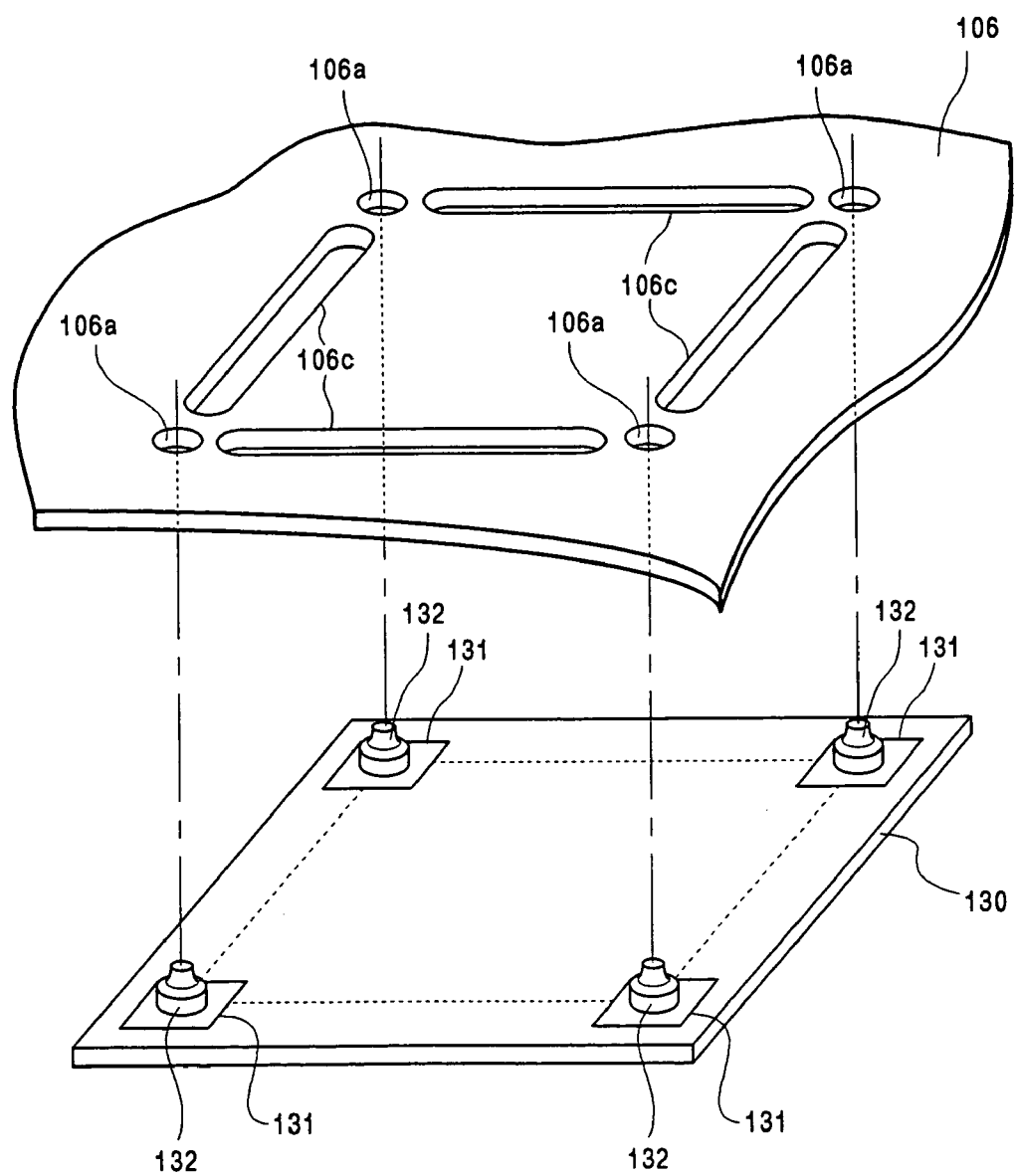
FIG. 12 is a diagram for explaining a positioning method in the case where a transfer board 106 is provided with locating holes 106a only with respect to some of the stud bumps 132.

In a later processing step, the stud bumps 132 are inserted into the locating holes 106a so as to provisionally attach the semiconductor IC 130 to the transfer board 106 in a positioned state. The diameter of the locating holes 106a is therefore made about the same size as or slightly larger than that of the stud bumps 132. The diameter of the locating holes 106a should not be set larger than necessary because, when too large relative to the diameter of the stud bumps 132, the semiconductor IC 130 cannot be provisionally attached to the transfer board 106. The number of the locating holes 106a formed can be fewer than the number of stud bumps 132 so long as the semiconductor IC 130 can nevertheless be provisionally attached to the transfer board 106. Specifically, as shown in FIG. 12, a structure can be adopted wherein locating holes 106a are formed for only some of the stud bumps 132 and regions corresponding to the remaining stud bumps 132 are formed with slots 106c of a size considerably larger than the diameter of the stud bumps 132 so that interference between the remaining stud bumps 132 and the transfer board 106 is avoided.

In another processing step conducted later, the post electrodes 120 are inserted into the locating holes 106b so as to position the transfer board 106 with respect to the transfer board 101. The diameter of the locating holes 106b therefore needs to be made slightly larger than that of the post electrodes 120. However, the diameter of the locating holes 106b should not be set larger than necessary because, when too large relative to the diameter of the post electrodes 120, the accuracy of the positioning is reduced.

Thus the locating holes 106a and locating holes 106b formed in the transfer board 106 are holes for insertion of the stud bumps 132 and post electrodes 120 in later processing steps. Since the relative positions among these holes is therefore a critical factor in determining accuracy, they must be formed with high accuracy. Insofar as the required processing accuracy can be ensured, it is possible to form the locating holes 106a and 106b by some other method, such as by drilling. This completes the processing of the transfer board 106.

The semiconductor IC 130 is also processed, separately from the processing carried out on the transfer board 101 and transfer board 106. As explained earlier, the processing with respect to the semiconductor IC 130 is of two types: thickness reduction by polishing and formation of the stud bumps 132. As was also pointed out earlier, the polishing for thickness reduction can be conducted by polishing the back surface 130b of numerous semiconductors ICs 130 in the wafer state to reduce the thickness t to 200 μm or less, e.g., to 20-50 μm, followed by dicing for separating them into individual semiconductor ICs 130. A wire bonder can be used to form the stud bumps 132 on the land electrodes 131 of the individual semiconductor ICs 130 after separation by dicing. By this there can be fabricated a semiconductor IC 130 such as shown in FIG. 2 that is reduced in thickness and formed on its land electrodes 131 with stud bumps 132.

Figure 13:
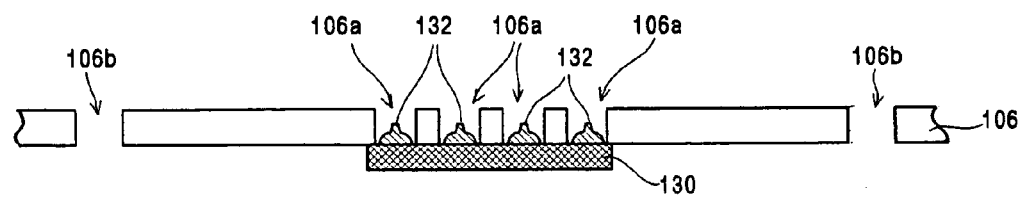
FIG. 13 is a diagram showing still another part of the fabrication process of the module with embedded semiconductor IC 100 (provisional attachment of semiconductor IC 130).

Upon completion of the processing of the transfer board 106 and the semiconductor IC 130, the stud bumps 132 of the semiconductor IC 130 are inserted into the locating holes 106a formed in the transfer board 106, thereby provisionally attaching the semiconductor IC 130 to the transfer board 106 (FIG. 13). This positions the semiconductor IC 130 on the transfer board 106.

Figure 14:
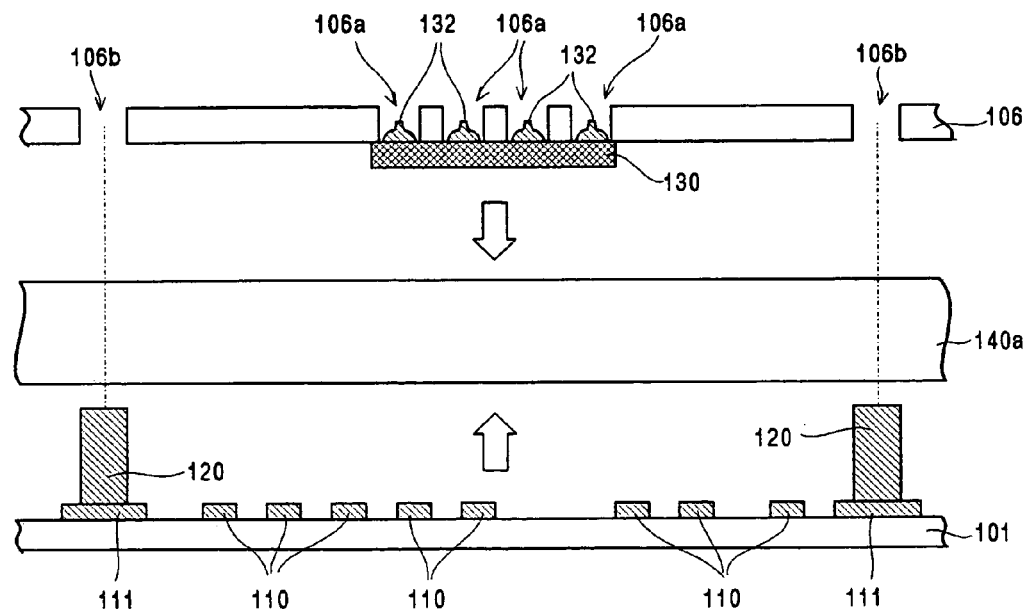
FIG. 14 is a diagram showing still another part of the fabrication process of the module with embedded semiconductor IC 100 (pressing by transfer boards 101 and 106).
Figure 15:
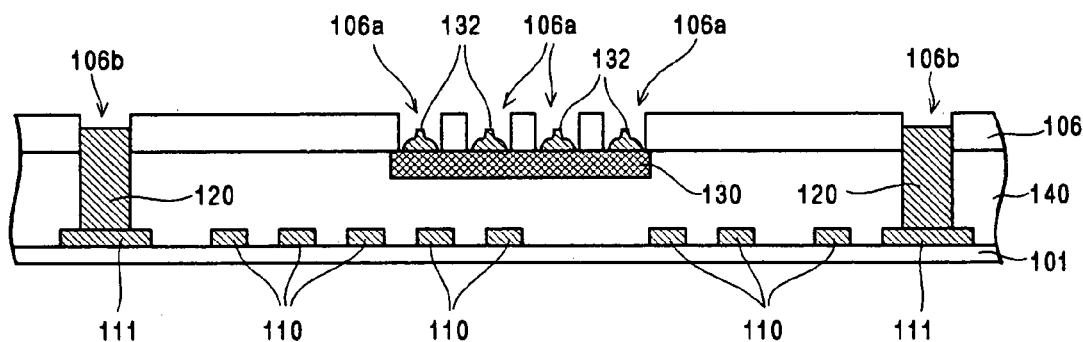
FIG. 15 is a diagram showing still another part of the fabrication process of the module with embedded semiconductor IC 100 (formation of resin layer 140).
Figure 16:
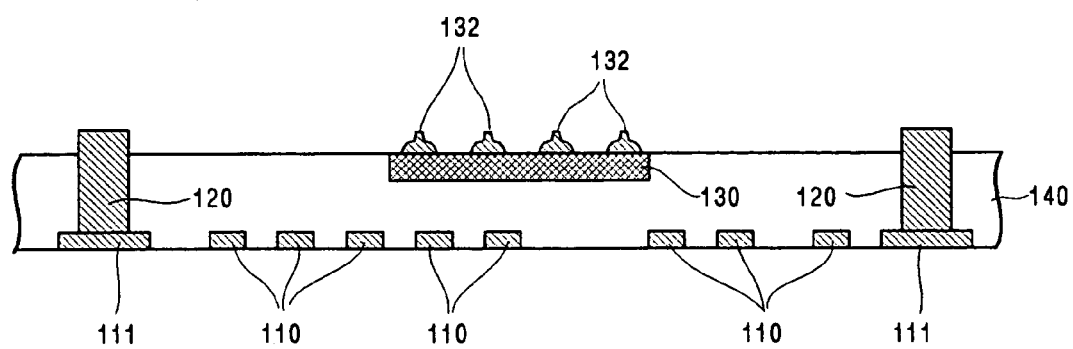
FIG. 16 is a diagram showing still another part of the fabrication process of the module with embedded semiconductor IC 100 (removing transfer boards 101 and 106).

Next, a prepreg 140a is pressed between the transfer board 101 and transfer board 106 while positioning the transfer board 106 with respect to the transfer board 101, so as to insert the post electrodes 120 into the locating holes 106b formed in the transfer board 106 (FIG. 14). The prepreg 140a is a sheet obtained by impregnating carbon fiber, glass fiber, aramid fiber or other such fiber with epoxy or other unhardened thermosetting resin having high mechanical strength, low water absorption property and high adhesive property with respect to the semiconductor IC 130. When the prepreg 140a is pressed with heating, the thermosetting resin therein hardens to form the resin layer 140 (FIG. 15). As a result, the lower board wiring pattern 110 and lower board wiring pattern 111, post electrodes 120 and semiconductor IC 130 are united by the resin layer 140 and the back surface 130b and peripheral surface 130c of the semiconductor IC 130 are covered by the resin layer 140. The main surface 130a of the semiconductor IC 130 is not covered by the resin layer 140 and remains exposed. The transfer board 101 and transfer board 106 are then peeled off to obtain a unitary laminated body (FIG. 16). As shown in FIG. 16, after the transfer board 101 and transfer board 106 have been peeled off, the post electrodes 120 and stud bumps 132 are in a protruding state. The planar positional relationship between the post electrodes 120 and stud bumps 132 coincides substantially with the planar positional relationship between the locating holes 106a and locating holes 106b formed in the transfer board 106. The positional relationship between the two is therefore substantially fixed.

Figure 17:
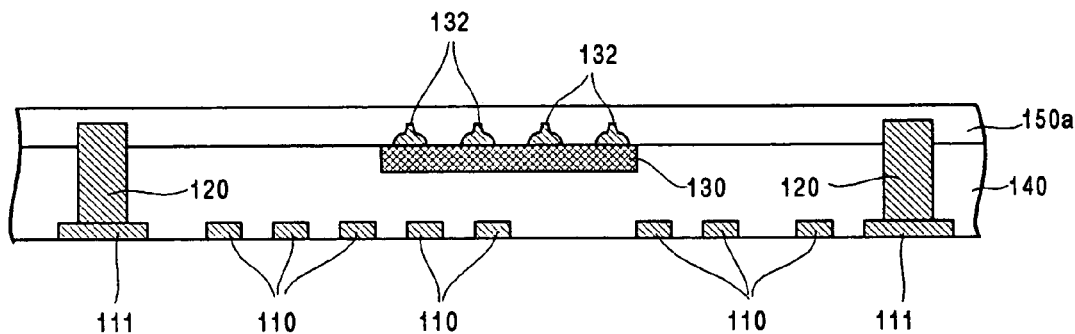
FIG. 17 is a diagram showing still another part of the fabrication process of the module with embedded semiconductor IC 100 (formation of prepreg 150a).
Figure 18:
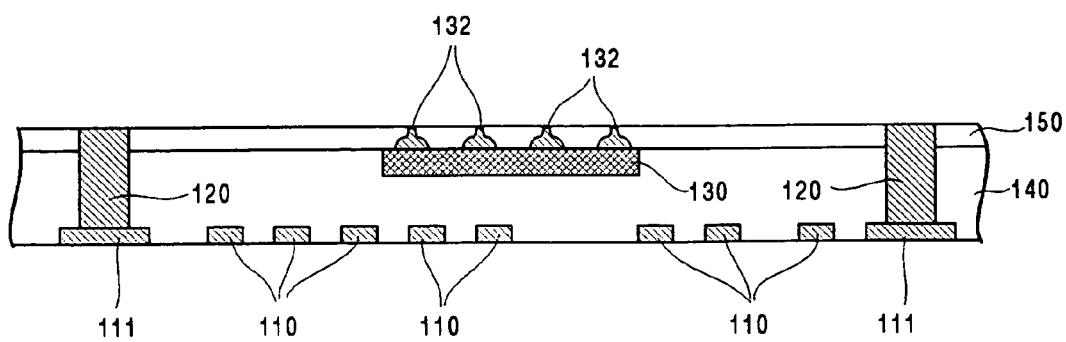
FIG. 18 is a diagram showing still another part of the fabrication process of the module with embedded semiconductor IC 100 (formation of resin layer 150).

The surface from which the post electrodes 120 and stud bumps 132 protrude is then overlaid with a prepreg 150a so as to completely cover the protruding post electrodes 120 and stud bumps 132 (FIG. 17). The prepreg 150a used is preferably made of a different material from that of the prepreg 140a used to form the resin layer 140. Specifically, it is preferably made of a material high in Q value and low in dielectric constant, such as a material obtained by blending a filler into a poly(vinyl benzyl ether) compound resin. The prepreg 150a is hardened by application of heat to form the resin layer 150, whereafter the surface region thereof is removed by grinding or blasting to expose the post electrodes 120 and stud bumps 132 (FIG. 18).

Figure 19:
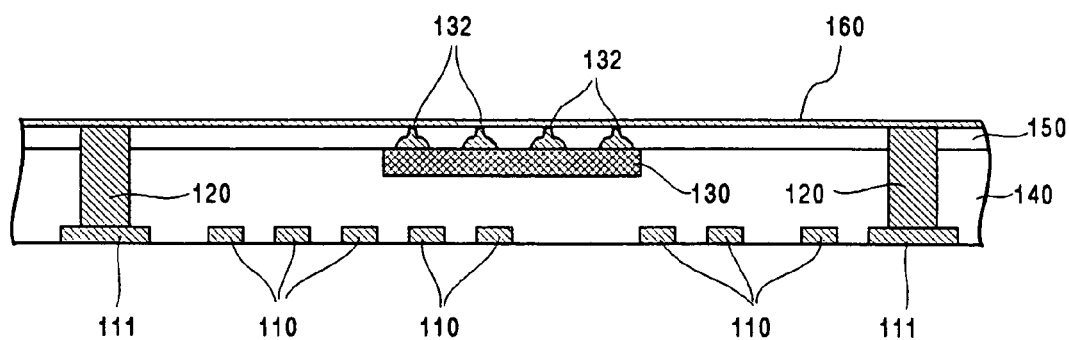
FIG. 19 is a diagram showing still another part of the fabrication process of the module with embedded semiconductor IC 100 (formation of under conductor layer 160).

Next, a sputtering or other such vapor phase growth method is used to form an under conductor layer 160 completely covering the surface on the side where the post electrodes 120 and stud bumps 132 are exposed (FIG. 19). The method of forming the under conductor layer 160 is not limited to the vapor phase growth method. It can instead be formed by plating or by attaching a metal foil. Since unnecessary portions of the under conductor layer 160 are later removed, the thickness of the under conductor layer 160 needs to be set sufficiently thin, at around 0.3 μm, for example.

Figure 20:
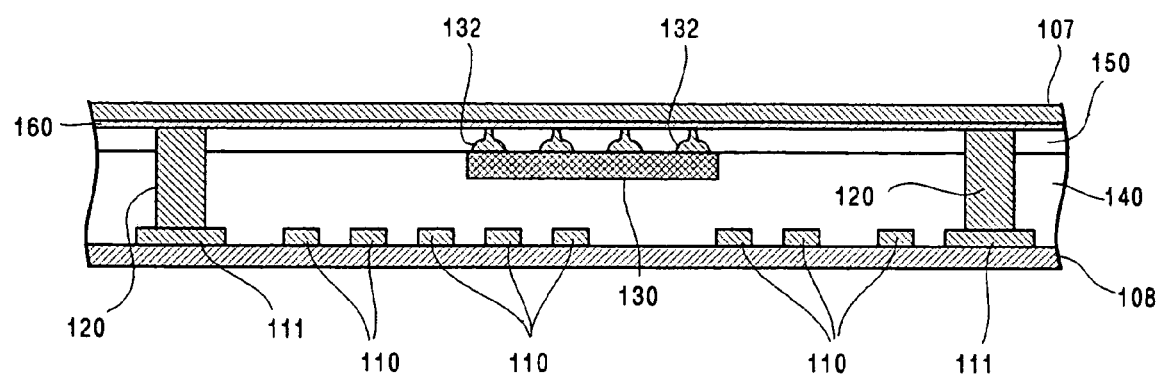
FIG. 20 is a diagram showing still another part of the fabrication process of the module with embedded semiconductor IC 100 (formation of dry films 107 and 108).

Next, photosensitive dry films 107 and 108 are attached to the surfaces of the laminated body, i.e., to the surface of the resin layer 140 and the surface of the under conductor layer 160 (FIG. 20). The thickness of the dry film 107 needs to be made somewhat thicker than the upper board wiring patterns 170 and 171. For example, when the thickness of the upper board wiring patterns 170 and 171 is about 20 μm, the thickness of the dry film 107 should be made about 25 μm. The dry film 108 is provided for the purpose of preventing electroplating of the surface of the resin layer 140 formed with the lower board wiring patterns 110 and 111 and can be of any desired thickness.

Figure 21:
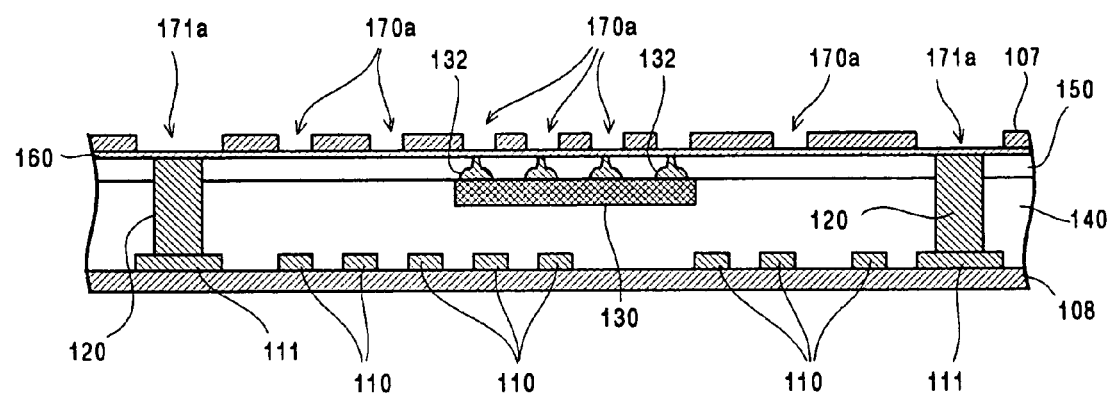
FIG. 21 is a diagram showing still another part of the fabrication process of the module with embedded semiconductor IC 100 (patterning dry film 107).

Next, the dry film 107 is exposed using a photomask (not shown) and the dry film 107 is removed at the regions 170*a* and 171*a* where the upper board wiring patterns 170 and 171 are to be formed (FIG. 21). This exposes the under conductor layer 160 at the regions 170*a* and regions 171*a*. As the dry film 108 is not removed at this time, the surface of the resin layer 140 formed with the lower board wiring patterns 110 and 111 remains covered substantially throughout.

As shown in FIG. 21, the regions 170*a* where the upper board wiring pattern 170 is to be formed include regions lying opposite the stud bumps 132. Since, as was explained earlier, a semiconductor IC 130 having a very narrow electrode pitch is used in this embodiment, a large planar direction shift in the positional relationship between the stud bumps 132 and the regions 170*a* cannot not be tolerated. However, as was also pointed out earlier, the positional relationship in the planar direction of the stud bumps 132 and the post electrodes 120 is substantially fixed. This means that the positional relationship between the photomask pattern corresponding to the regions 170*a* and the photomask pattern corresponding to the regions 171*a* substantially coincide with the positional relation in the planar direction between the stud bumps 132 and the post electrodes 120. The regions of the under conductor layer 160 corresponding to the stud bumps 132 can therefore be accurately exposed.

Figure 22:
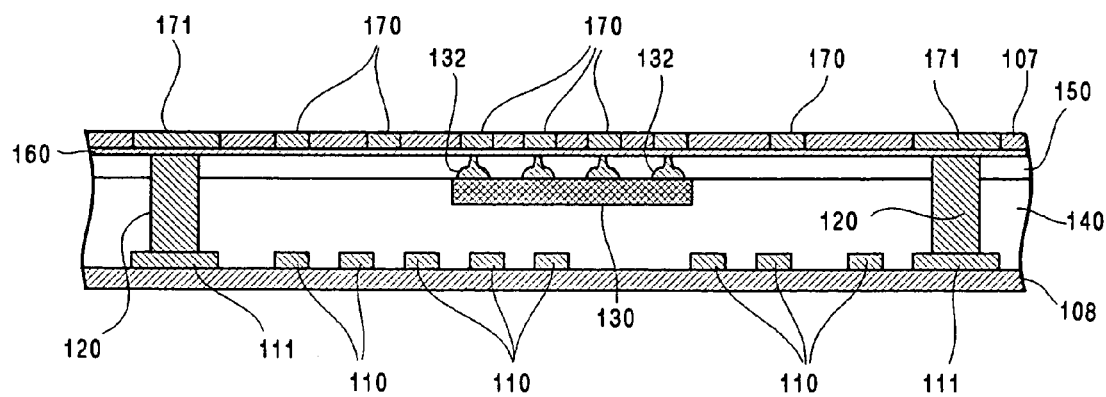
FIG. 22 is a diagram showing still another part of the fabrication process of the module with embedded semiconductor IC 100 (formation of upper board wiring patterns 170 and 171).
Figure 23:
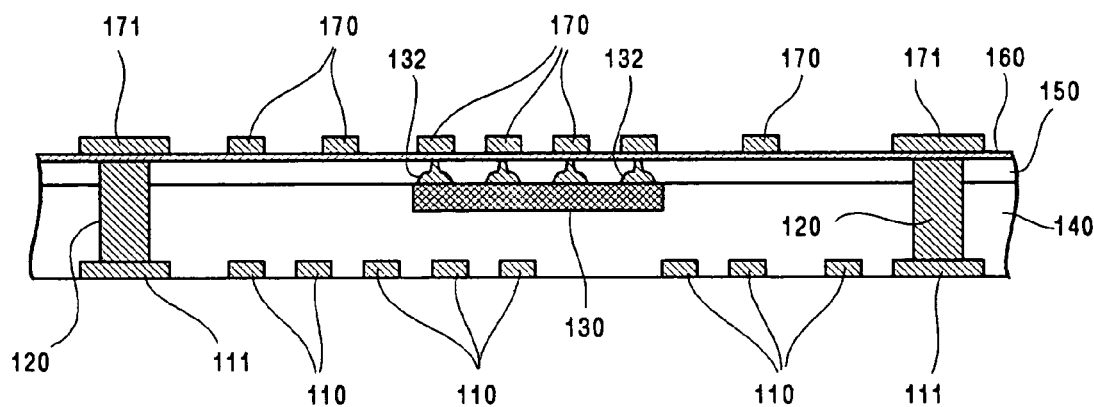
FIG. 23 is a diagram showing still another part of the fabrication process of the module with embedded semiconductor IC 100 (removing dry films 107 and 108).

After portions of the under conductor layer 160 have been exposed in this manner, electroplating is conducted with the under conductor layer 160 as the substrate. This forms the upper board wiring patterns 170 and 171 at the regions 170*a* and 171*a* where the under conductor layer 160 is exposed (FIG. 22). The surface of the resin layer 140 is not electroplated because substantially its total surface is covered by the dry film 108. The type of plating solution used, which is selected as explained earlier, can be copper sulfate. The dry films 107 and 108 are then peeled off to obtain a laminated body having the upper board wiring patterns 170 and 171 formed on the surface of the under conductor layer 160 (FIG. 23).

Figure 24:
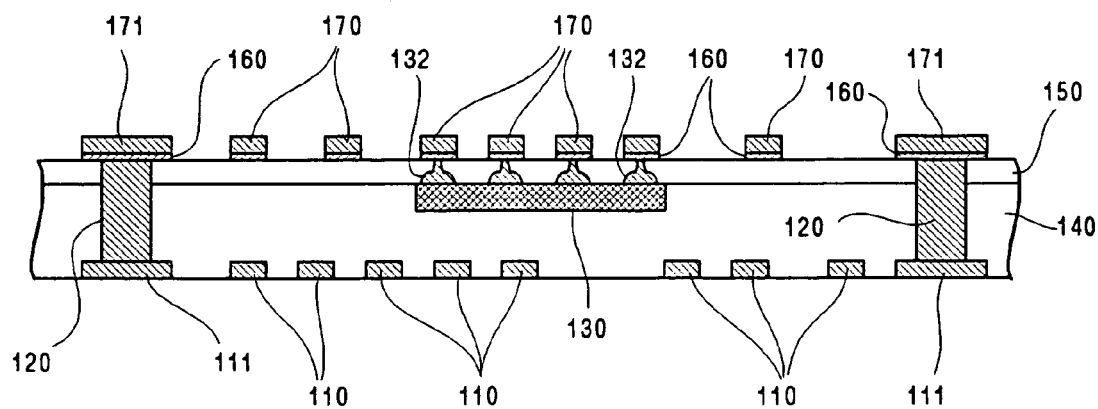
FIG. 24 is a diagram showing still another part of the fabrication process of the module with embedded semiconductor IC 100 (removing under conductor layer 160).

An etchant such as an acid is then used to remove (by soft etching) the unnecessary under conductor layer 160 at portions where the upper board wiring patterns 170 and 171 are not formed (FIG. 24). Next, the surfaces of the laminated body are covered with the photosensitive protective layers 180 and 181, which are then removed at portions corresponding to the regions where capacitors and other passive components are to be mounted, thereby exposing portions of the lower board wiring pattern 110 and upper board wiring pattern 170. Finally, the passive components are mounted to complete the module with embedded semiconductor IC 100 shown in FIG. 1.

As explained in the foregoing, the transfer board 106 having the locating holes 106*a* and 106*b* is used to fabricate the module with embedded semiconductor IC 100 of this embodiment. The positional relationship between the stud bumps 132 and post electrodes 120 in the planar direction is therefore substantially fixed. As a result, the positional relationship between photomask pattern corresponding to the regions 170*a* and the photomask pattern corresponding to the regions 171*a* substantially coincides with the positional relationship between the stud bumps 132 and the post electrodes 120 in the planar direction. From this it follows that, at the time of forming the upper board wiring patterns 170 and 171, accurate registration with respect to the stud bumps 132 can be achieved. Therefore, even if a semiconductor IC 130 having a very narrow electrode pitch of 100 μm or smaller, e.g., 60 μm, is used, deviation in the positional relationship between the land electrodes 131/stud bumps 132 and the upper board wiring pattern 170 can be held to the minimum.

In addition, since the semiconductor IC 130 used in this embodiment is polished down to a very small thickness t, the module with embedded semiconductor IC 100 can be obtained at a very thin thickness of, for example, around 200 μm.

In the method of fabrication described in the foregoing, the formation of the resin layer 150 is followed by grinding or blasting of its surface to expose the post electrodes 120 and stud bumps 132 (see FIG. 18). However, the exposure of the post electrodes 120 and stud bumps 132 can instead be achieved by using a laser or the like to form holes. This method will now be explained with reference to the drawings.

FIGS. 25 to 31 are process diagrams for explaining a method of fabrication in the case where the post electrodes 120 and stud bumps 132 are exposed by forming holes.

Figure 25:
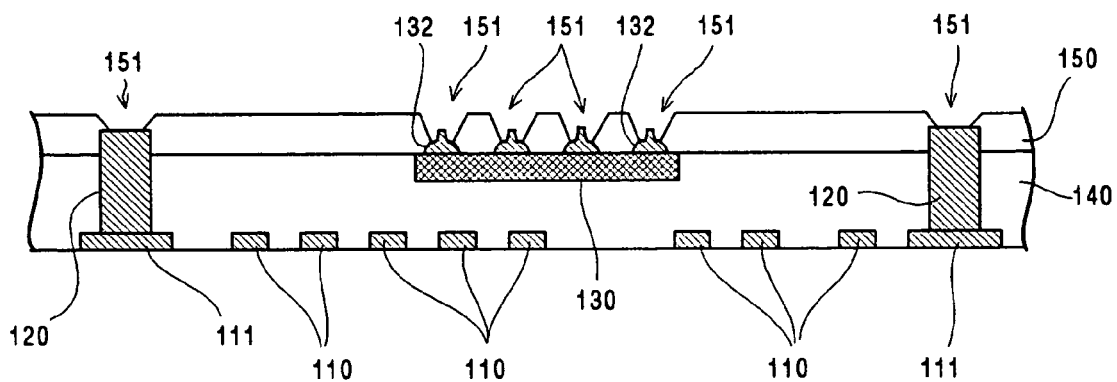
FIG. 25 is a diagram showing a part of another fabrication process of the module with embedded semiconductor IC 100 (formation of holes 151).
Figure 26:
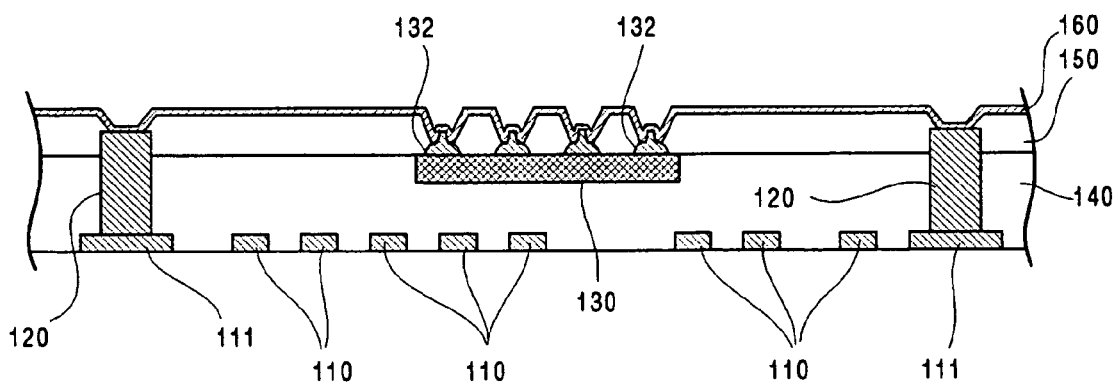
FIG. 26 is a diagram showing another part of the fabrication process of the module with embedded semiconductor IC 100 (formation of under conductor layer 160).
Figure 27:
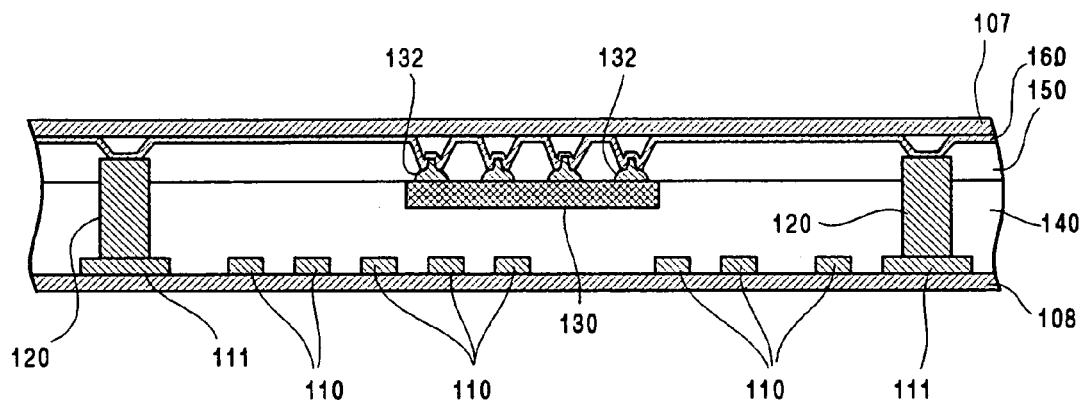
FIG. 27 is a diagram showing still another part of the fabrication process of the module with embedded semiconductor IC 100 (removing dry films 107 and 108).

After the fabrication process has been completed through the step illustrated in FIG. 17, a laser beam is irradiated onto the regions corresponding to the post electrodes 120 and stud bumps 132 to form holes 151 in the resin layer 150 and thus expose the post electrodes 120 and stud bumps 132 (FIG. 25). It is also possible to form the holes 151 by a method other than laser irradiation.

Figure 28:
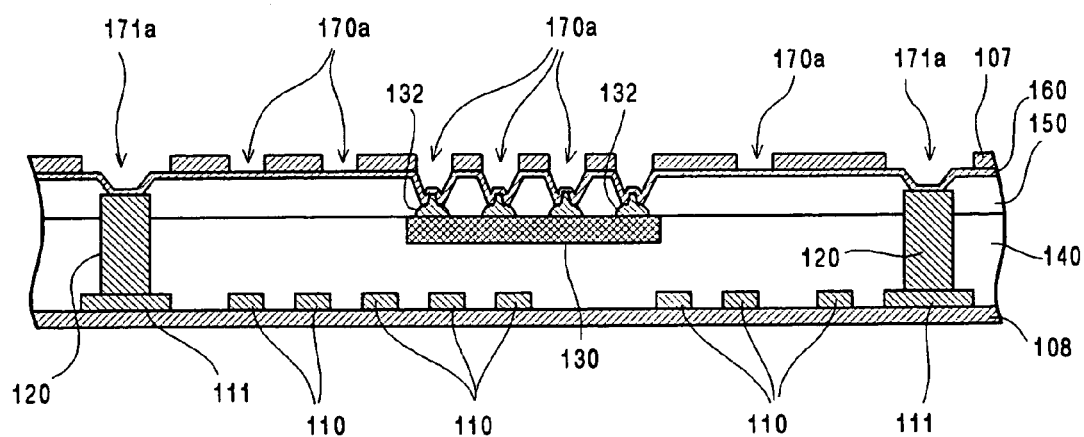
FIG. 28 is a diagram showing still another part of the fabrication process of the module with embedded semiconductor IC 100 (patterning dry film 107).
Figure 29:
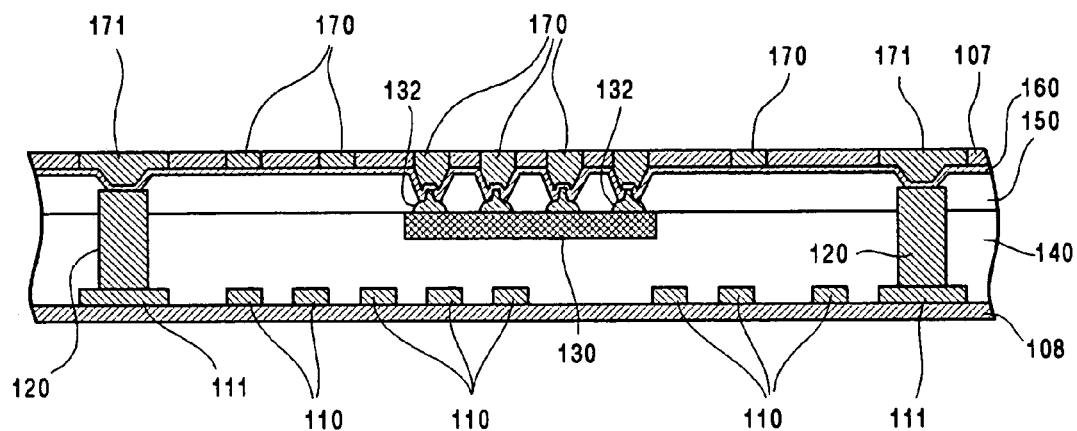
FIG. 29 is a diagram showing still another part of the fabrication process of the module with embedded semiconductor IC 100 (formation of upper board wiring patterns 170 and 171).
Figure 30:
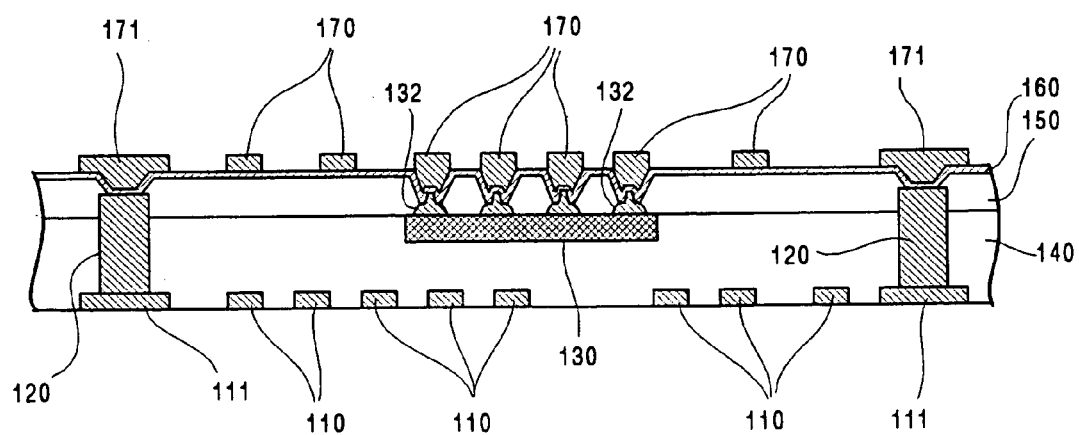
FIG. 30 is a diagram showing still another part of the fabrication process of the module with embedded semiconductor IC 100 (removing dry films 107 and 108).
Figure 31:
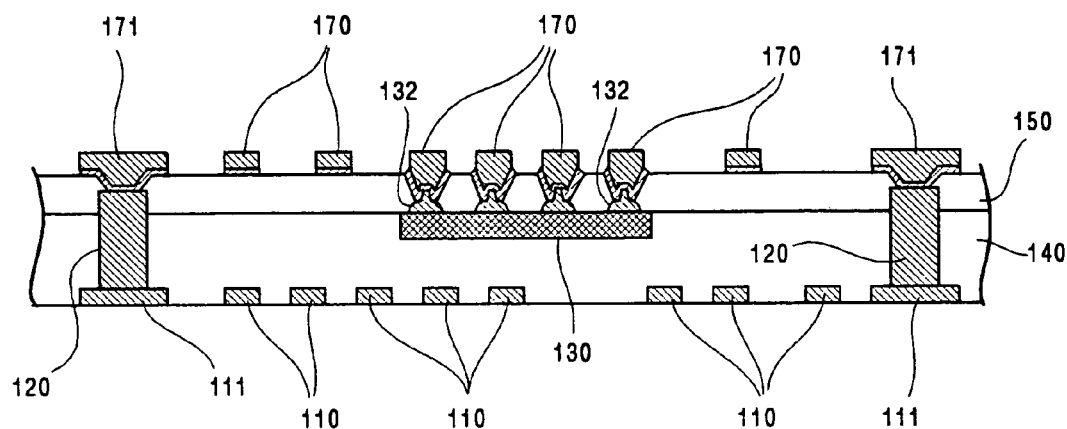
FIG. 31 is a diagram showing still another part of the fabrication process of the module with embedded semiconductor IC 100 (removing under conductor layer 160).

The remaining processes are similar to those shown in FIG. 19 onward. Specifically, the thin under conductor layer 160 is formed to completely cover the surface on the side where the post electrodes 120 and stud bumps 132 are exposed (FIG. 26), the photosensitive dry films 107, 108 are attached to the surfaces of the laminated body (FIG. 27), the dry film 107 is exposed using a photomask (not shown), and the dry film 107 is removed at the regions 170*a*, 171*a* (FIG. 28). Next, electroplating is conducted with the under conductor layer 160 as the substrate, thereby forming the upper board wiring patterns 170 and 171 at the regions 170*a* and 171*a*, respectively (FIG. 29). Following this, the dry films 107 and 108 are peeled off (FIG. 30) and the unnecessary under conductor layer 160 at portions where the upper board wiring patterns 170 and 171 are not formed is removed (by soft etching) (FIG. 31). Next, the surfaces of the laminated body are covered with the photosensitive protective layers 180 and 181, which are then removed at portions corresponding to the regions where capacitors and other passive components are to be mounted, thereby exposing portions of the lower board wiring pattern 110 and upper board wiring pattern 170. Finally, the passive components are mounted to complete the module with embedded semiconductor IC.

A module with embedded semiconductor IC that is another embodiment of the present invention will be explained.

Figure 32:
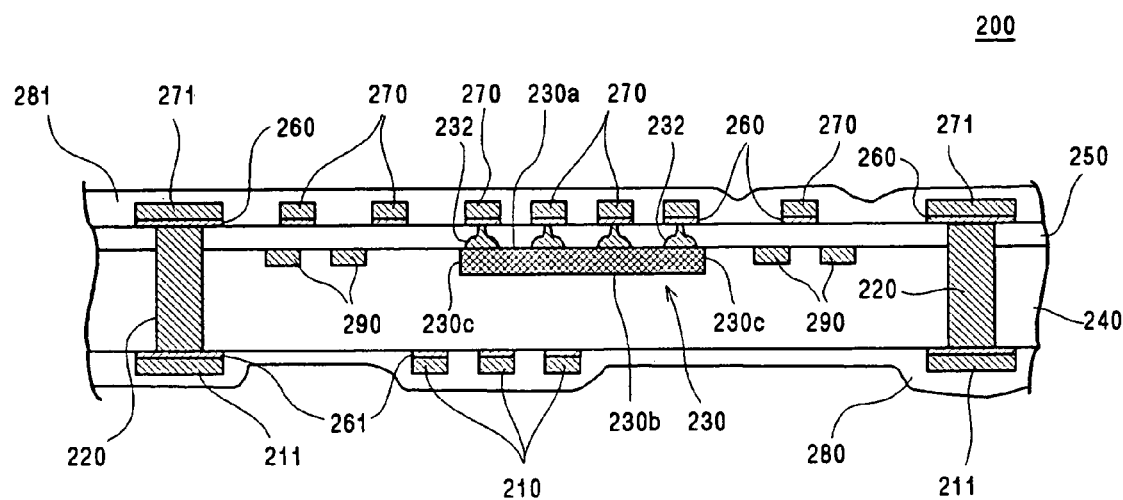
FIG. 32 is a schematic sectional view showing the structure of a module with embedded semiconductor IC 200 that is another preferred embodiment of the present invention.

FIG. 32 is a schematic sectional view showing the structure of a module with embedded semiconductor IC 200 that is another preferred embodiment of the present invention.

As shown in FIG. 32, the module with embedded semiconductor IC 200 of this embodiment has a laminated resin layer 240 and resin layer 250, a semiconductor IC 230 and an internal board wiring pattern 290 (third circuit board wiring pattern) embedded between the resin layer 240 and resin layer 250, lower board wiring patterns 210, 211 formed on the surface of the resin layer 240, upper board wiring patterns 270, 271 formed on the surface of the resin layer 250, an under conductor layer 261 formed on resin layer 240 side of the lower board wiring patterns 210, 211, an under conductor layer 260 formed on the resin layer 250 side of the upper board wiring patterns 270, 271, post electrodes 220 formed as embedded in and passing through the resin layer 240 and resin layer 250 to electrically connect the lower board wiring pattern 211 and the upper board wiring pattern 271, a protective layer 280 covering the surface of the resin layer 240 and the lower board wiring patterns 210, 211, and a protective layer 281 covering the surface of the resin layer 250 and the upper board wiring patterns 270, 271. Thus the module with embedded semiconductor IC 200 according to this embodiment differs from the module with embedded semiconductor IC 100 described earlier chiefly in the point that it is provided with the internal board wiring pattern 290 and the point that the lower board wiring patterns 210 and 211 are not embedded in the resin layer 240 but formed on the surface thereof.

The module with embedded semiconductor IC 200 according to this embodiment also has capacitors and other such passive components that are mounted on the surfaces of the protective layers 280 and 281 and are electrically connected to the lower board wiring patterns 210 and 211 or the upper board wiring patterns 270 and 271 through via holes (BVH) formed in the protective layers 280 and 281. As shown in FIG. 32, the embedded semiconductor IC 230, which can be of the same type as the semiconductor IC 130 used in the module with embedded semiconductor IC 100, is electrically connected to the upper board wiring pattern 270 through stud bumps 232.

Also in the module with embedded semiconductor IC 200 of this embodiment, the back surface 230b and peripheral surface 230c of the semiconductor IC 230 are in contact with the resin layer 240, while the main surface 230a of the semiconductor IC 230 is in contact with the resin layer 250. As a result, the majority of the surface area of the semiconductor IC 230 is in contact with the resin layer 240 and the stud bumps 232 are in contact with the resin layer 250. The resin layer 240 is a layer similar to the resin layer 140 of the module with embedded semiconductor IC 100 described earlier and is formed of a material good in physical protective properties with respect to the semiconductor IC 230. The resin layer 250 is a layer similar to the resin layer 150 of the module with embedded semiconductor IC 100 and is formed of a material good in electrical properties.

A method of fabricating the module with embedded semiconductor IC 200 shown in FIG. 32 will now be explained with reference to the drawings.

FIGS. 33 to 49 are process diagrams for explaining the method of fabricating the module with embedded semiconductor IC 200 shown in FIG. 32.

Figure 33:
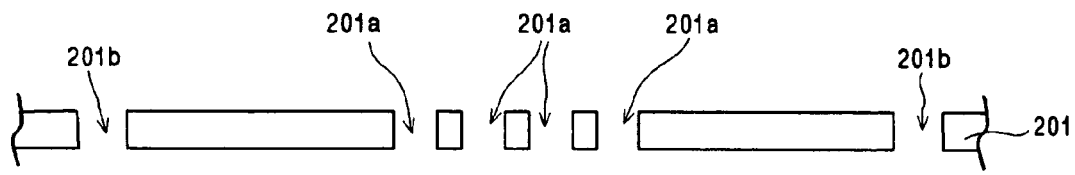
FIG. 33 is a diagram showing a part of the fabrication process of the module with embedded semiconductor IC 200 (formation of locating holes 201a and 201b).
Figure 34:
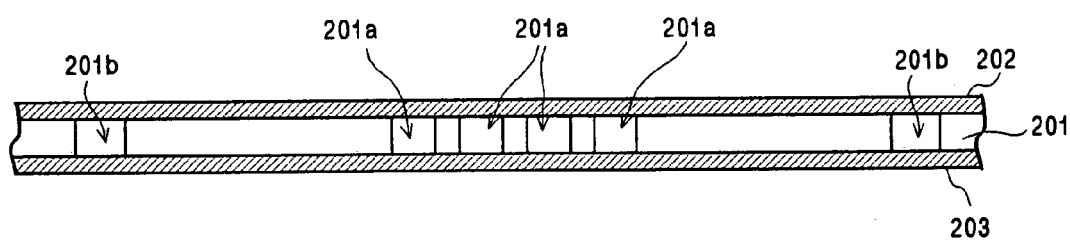
FIG. 34 is a diagram showing another part of the fabrication process of the module with embedded semiconductor IC 200 (formation of dry films 202 and 203).

First, a transfer board 201 is prepared and prescribed regions thereof are removed by etching using an etching mask (not shown) to form locating holes 201a and locating holes 201b (FIG. 33). The transfer board 201 can be made of the same material and given the same thickness as the transfer board 101 of the foregoing embodiment and the locating holes 201a, 201b can be formed by the method used to form the locating holes 106a, 106b of the transfer board 106.

In a later processing step, the stud bumps 232 are inserted into the locating holes 201a so as to provisionally attach the semiconductor IC 230 to the transfer board 201 in a positioned state. The diameter of the locating holes 201a therefore needs to be made about the same size as or slightly larger than that of the stud bumps 232. As was explained with reference to FIG. 12, a structure can be adopted wherein locating holes 201a are formed for only some of the stud bumps 232 and regions corresponding to the remaining stud bumps 232 are formed with slots of a size considerably larger than the diameter of the stud bumps 232 so that interference between the remaining stud bumps 232 and the transfer board 201 is avoided. In another processing step conducted later, the post electrodes 220 are inserted into the locating holes 201b so as to position the transfer board 201 with respect to a transfer board 206 discussed later.

Figure 35:
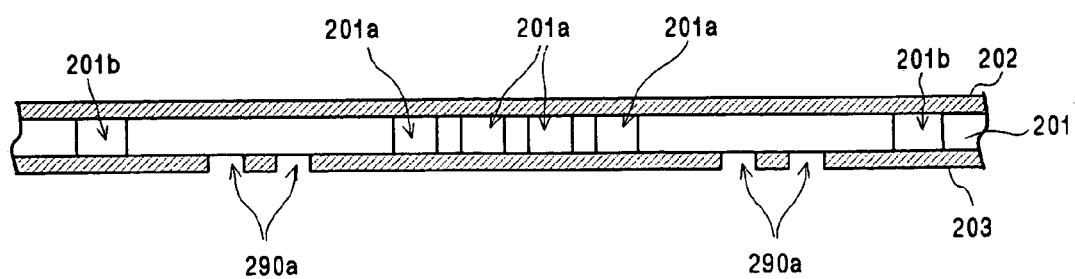
FIG. 35 is a diagram showing still another part of the fabrication process of the module with embedded semiconductor IC 200 (patterning dry film 203).

Next, photosensitive dry films 202 and 203 are attached to the surfaces of the transfer board 206 (FIG. 34) and the dry film 203 is exposed using a photomask (not shown) to remove the dry film 203 at regions 290a where the internal board wiring pattern 290 is to be formed (FIG. 35). The dry film 202 is not removed at this time.

Figure 36:
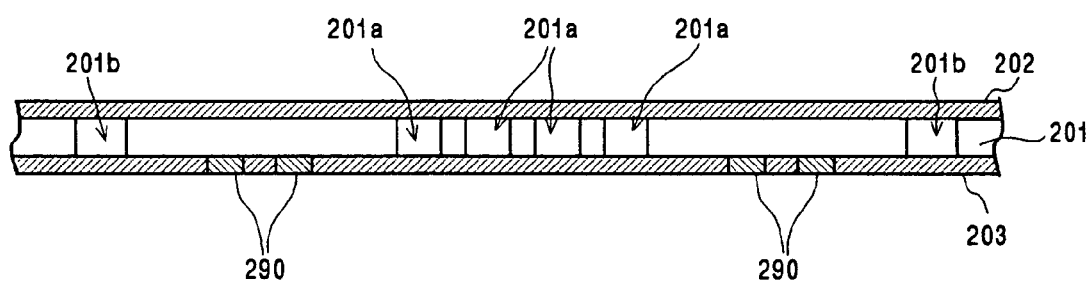
FIG. 36 is a diagram showing still another part of the fabrication process of the module with embedded semiconductor IC 200 (formation of internal board wiring pattern 290).
Figure 37:
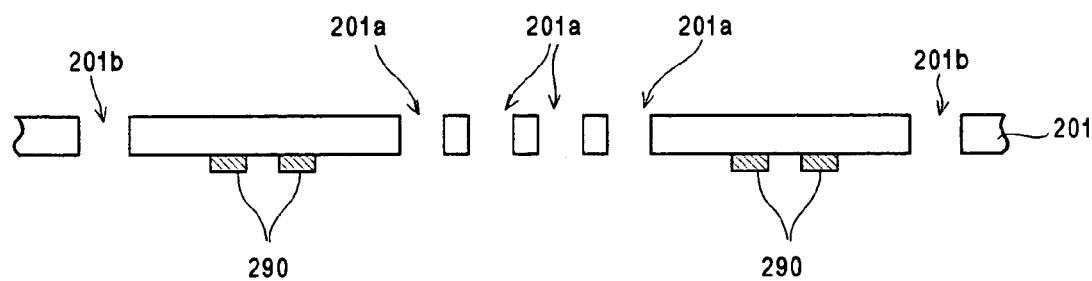
FIG. 37 is a diagram showing still another part of the fabrication process of the module with embedded semiconductor IC 200 (removing dry films 202 and 203).

After portions of underside of the transfer board 201 have been exposed in this manner, electroplating is conducted with the transfer board 201 as the substrate. This forms the internal board wiring pattern 290 at the regions 290a (FIG. 36). The dry films 202 and 203 are then peeled off to obtain the transfer board 201 with the internal board wiring pattern 290 formed on its underside (FIG. 37).

Figure 38:
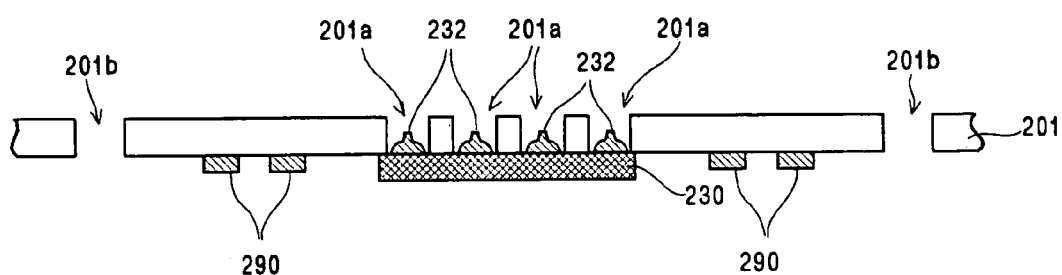
FIG. 38 is a diagram showing still another part of the fabrication process of the module with embedded semiconductor IC 200 (provisional attachment of semiconductor IC 230).

Next, the stud bumps 232 of the semiconductor IC 230 having the same structure as the semiconductor IC 130 of the earlier embodiment are inserted into the locating holes 201a formed in the transfer board 201, thereby provisionally attaching the semiconductor IC 230 to the transfer board 201 (FIG. 38). This positions the semiconductor IC 230 on the transfer board 201.

Figure 39:
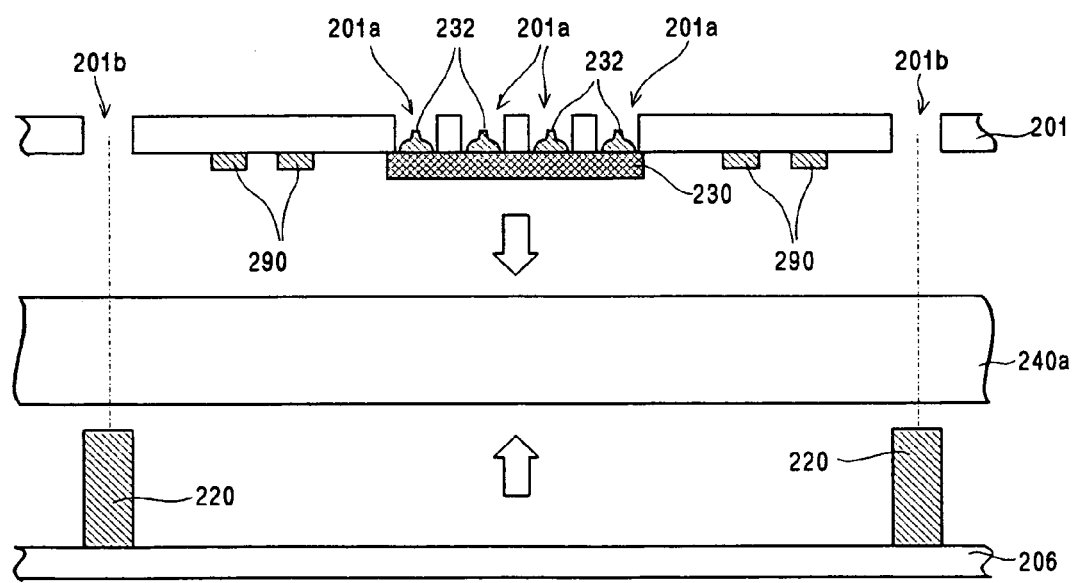
FIG. 39 is a diagram showing still another part of the fabrication process of the module with embedded semiconductor IC 200 (pressing by transfer boards 201 and 206).
Figure 40:
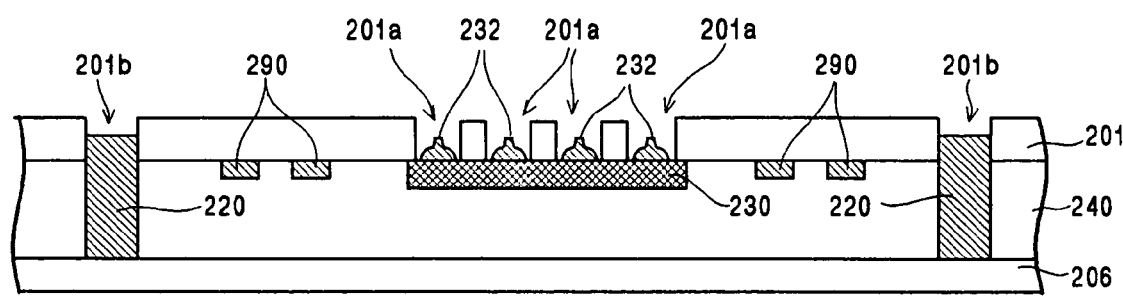
FIG. 40 is a diagram showing still another part of the fabrication process of the module with embedded semiconductor IC 200 (formation of resin layer 240).
Figure 41:
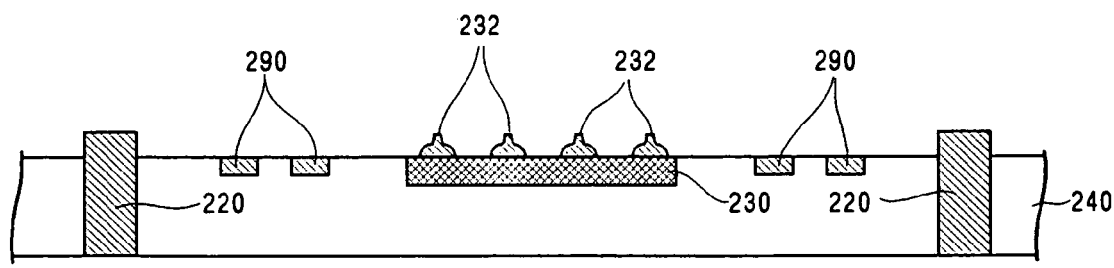
FIG. 41 is a diagram showing still another part of the fabrication process of the module with embedded semiconductor IC 200 (removing transfer boards 201 and 206).

Another transfer board 206 is prepared separately of the transfer board 201. The post electrodes 220 are formed on the surface of the transfer board 206 by the same method as used to form the internal board wiring pattern 290 on the transfer board 201. Next, a prepreg 240a is pressed between the transfer board 201 and transfer board 206 while positioning the transfer board 201 with respect to the transfer board 206 so as to insert the post electrodes 220 into the locating holes 201b formed in the transfer board 201 (FIG. 39). The prepreg 240a is in this state is hardened by heating to form the resin layer 240 (FIG. 40). As a result, the internal board wiring pattern 290, post electrodes 220 and semiconductor IC 230 are united by the resin layer 240. The transfer board 201 and transfer board 206 are then peeled off to obtain a unitary laminated body (FIG. 41). The planar positional relationship between the post electrodes 220 and stud bumps 232 coincides substantially with the planar positional relationship between the locating holes 201a and locating holes 201b formed in the transfer board 201. The positional relationship between the two is therefore substantially fixed.

Figure 42:
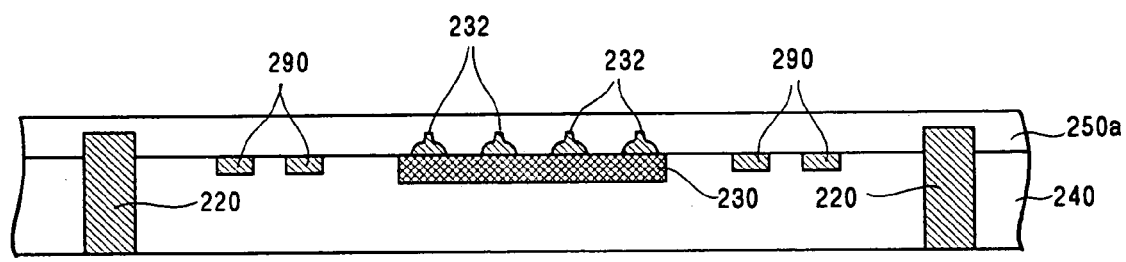
FIG. 42 is a diagram showing still another part of the fabrication process of the module with embedded semiconductor IC 200 (formation of prepreg 250a).
Figure 43:
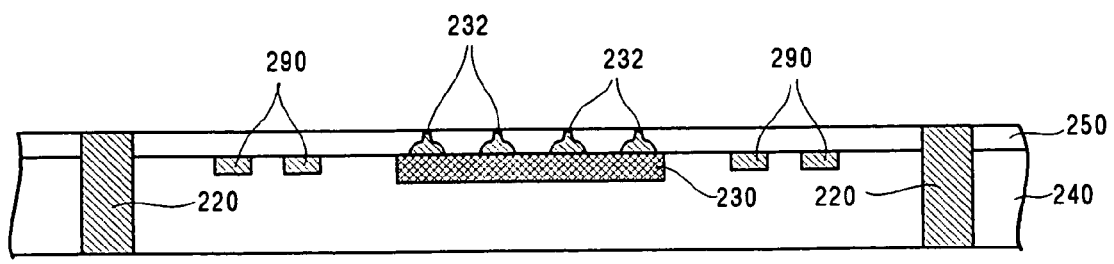
FIG. 43 is a diagram showing still another part of the fabrication process of the module with embedded semiconductor IC 200 (formation of resin layer 250).

The surface from which the post electrodes 220 and stud bumps 232 protrude is then overlaid with a prepreg 250a so as to completely cover the protruding post electrodes 220 and stud bumps 232 (FIG. 42). The prepreg 250a is hardened by application of heat to form the resin layer 250, whereafter the surface region thereof is removed by grinding or blasting to expose the post electrodes 220 and stud bumps 232 (FIG. 43).

Figure 44:
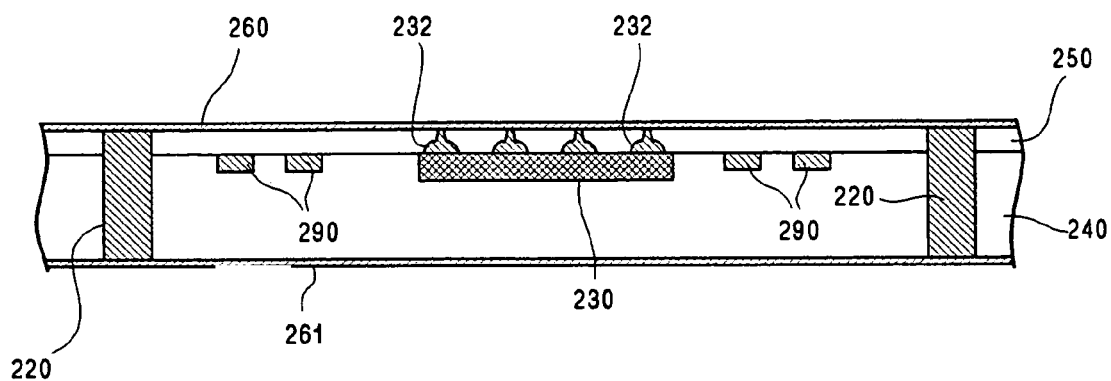
FIG. 44 is a diagram showing still another part of the fabrication process of the module with embedded semiconductor IC 200 (formation of under conductor layers 260 and 261).
Figure 45:
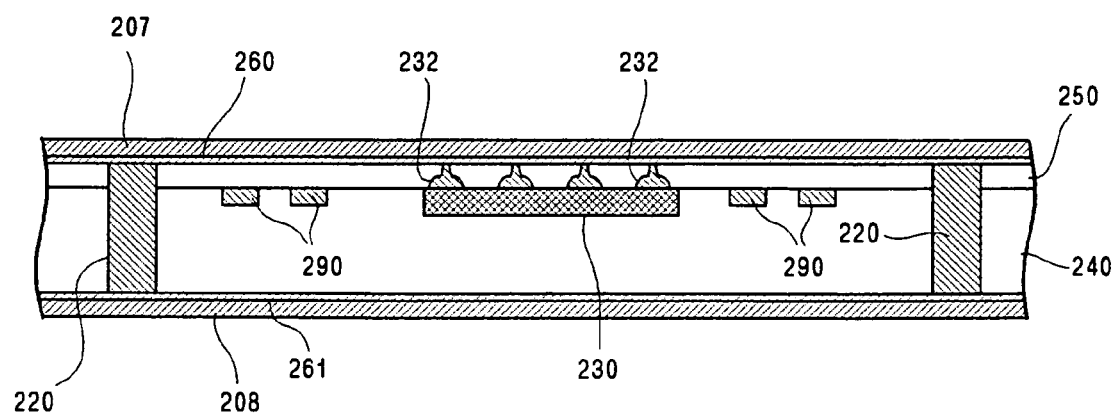
FIG. 45 is a diagram showing still another part of the fabrication process of the module with embedded semiconductor IC 200 (formation of dry films 207 and 208).
Figure 46:
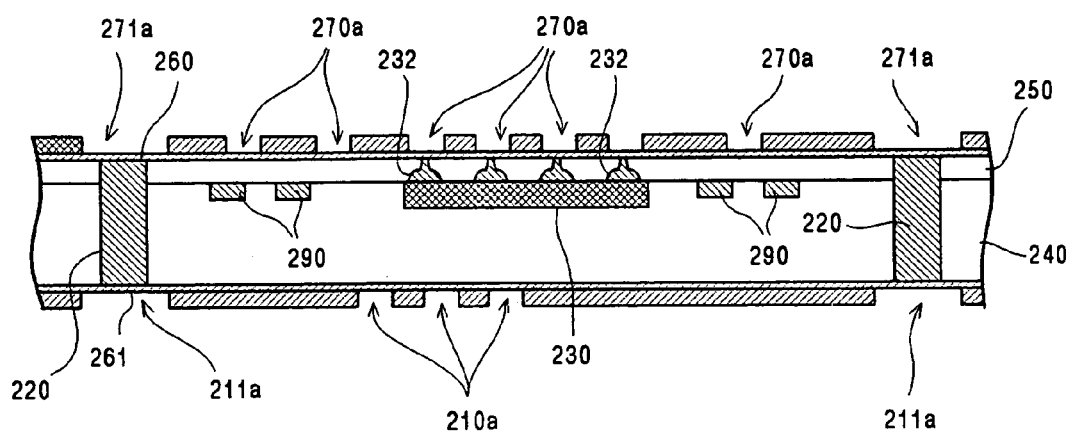
FIG. 46 is a diagram showing still another part of the fabrication process of the module with embedded semiconductor IC 200 (patterning dry films 207 and 208).

Next, the thin under conductor layer 260 is formed to completely cover the surface on the side where the resin layer 250 is formed, and the thin under conductor layer 261 is formed to completely cover the resin layer 240 (FIG. 44). In other words, an under conductor layer is formed on either surface of the laminated body. Next, photosensitive dry films 207 and 208 are attached to the surfaces of the laminated body, i.e., to the surface of the under conductor layer 260 and the surface of the under conductor layer 261 (FIG. 45). The dry films 207 and 208 are exposed using photomasks (not shown), whereby the dry film 207 is removed at the regions 270a and 271a where the upper board wiring patterns 270 and 271 are to be formed and the dry film 208 is removed at the regions 210a and 211a where the lower board wiring patterns 210 and 211 are to be formed (FIG. 46). This exposes the under conductor layer 260 at the regions 270a and regions 271a, and exposes the under conductor layer 261 at the regions 210a and regions 211a.

Here again, as shown in FIG. 46, the regions 270a where the upper board wiring pattern 270 is to be formed include regions lying opposite the stud bumps 232. However, since the positional relationship between the stud bumps 232 and the post electrodes 220 is substantially fixed in the planar direction, the regions of the under conductor layer 260 corresponding to the stud bumps 232 can be accurately exposed.

Figure 47:
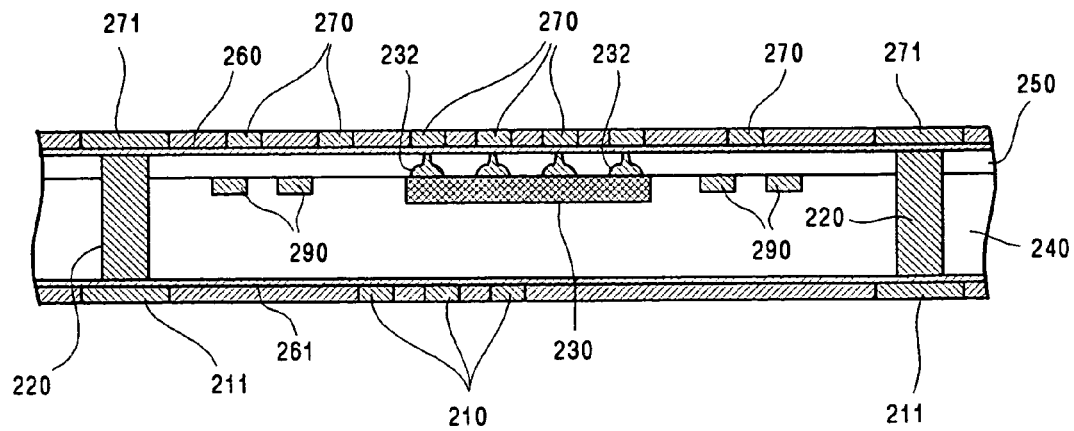
FIG. 47 is a diagram showing still another part of the fabrication process of the module with embedded semiconductor IC 200 (formation of upper board wiring patterns 270 and 271 and lower board wiring patterns 210 and 211).
Figure 48:
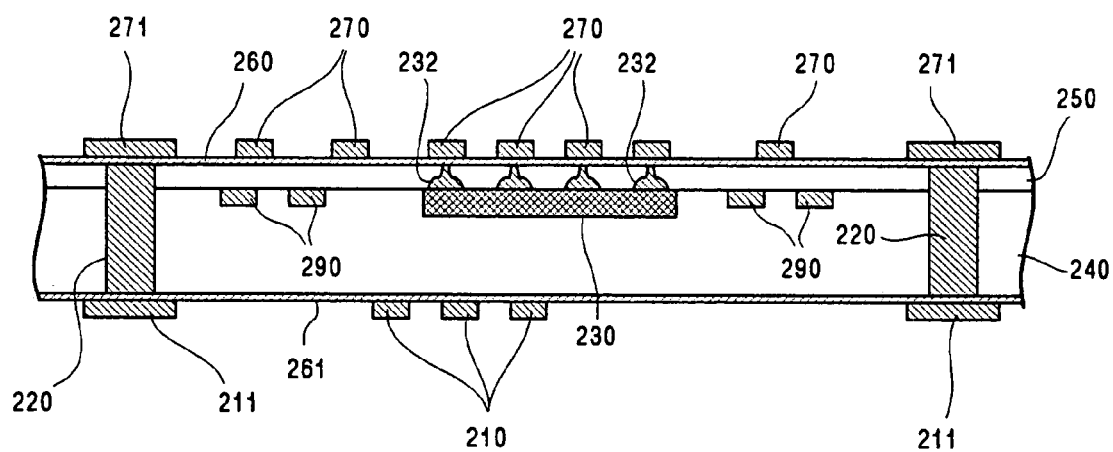
FIG. 48 is a diagram showing still another part of the fabrication process of the module with embedded semiconductor IC 200 (removing dry films 207 and 208).

After portions of the under conductor layers 260 and 261 have been exposed in this manner, electroplating is conducted with the under conductor layers 260 and 261 as substrates. This forms the upper board wiring patterns 270 and 271 at the regions 270a and 271a where the under conductor layer 260 is exposed and forms the lower board wiring patterns 210, 211 at the regions 210a and 211a where the under conductor layer 261 is exposed (FIG. 47). The dry films 207 and 208 are then peeled off to obtain a laminated body having the upper board wiring patterns 270 and 271 formed on the surface of the under conductor layer 260 and having the lower board wiring patterns 210 and 211 formed on the surface of the under conductor layer 261 (FIG. 48).

Figure 49:
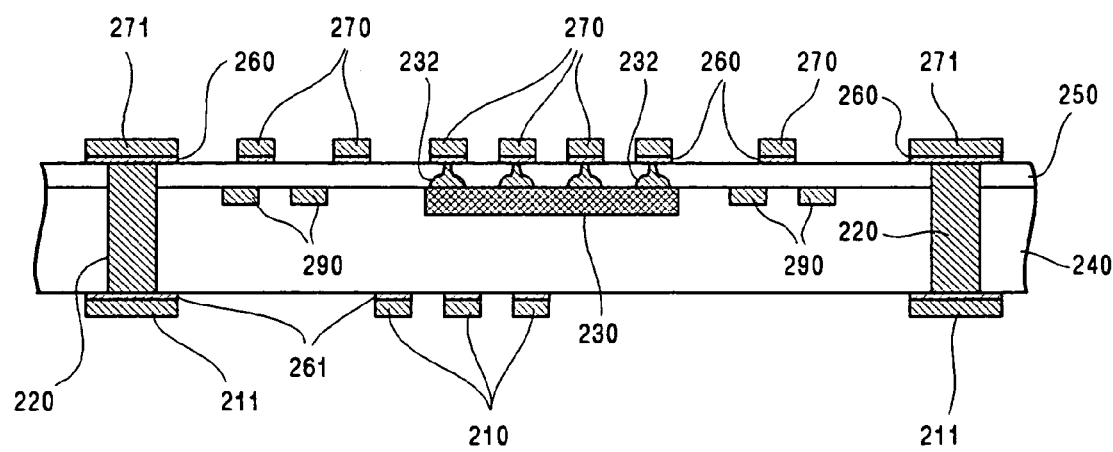
FIG. 49 is a diagram showing still another part of the fabrication process of the module with embedded semiconductor IC 200 (removing under conductor layers 260 and 261).

An etchant is then used to remove (by soft etching) the unnecessary under conductor layer 260 at portions where the upper board wiring patterns 270 and 271 are not formed and also remove (by soft etching) the unnecessary under conductor layer 261 at portions where the lower board wiring patterns 210 and 211 are not formed (FIG. 49). Next, the surfaces of the laminated body are covered with the photosensitive protective layers 280, 281, and portions of the protective layers 280, 281 and the resin layer 250 that correspond to the regions where capacitors and other passive components are to be mounted are removed. Finally, the passive components are mounted to complete the module with embedded semiconductor IC 200 shown in FIG. 32.

As explained in the foregoing, the transfer board 201 having the locating holes 201a and 201b is used to fabricate the module with embedded semiconductor IC 200 of this embodiment. The positional relationship between the stud bumps 232 and post electrodes 220 in the planar direction is therefore substantially fixed. As a result, deviation in the positional relationship between the stud bumps 232 and the post electrodes 220 in the planar direction can be held to the minimum to enable use of even a semiconductor IC 230 having a very narrow electrode pitch of 100 µm or smaller, e.g., 60 µm.

In addition, the formation of the internal board wiring pattern 290 in this embodiment makes it possible to implement a more complex wiring pattern.

In the method of fabrication described in the foregoing, the formation of the resin layer 250 is followed by grinding or blasting of its surface to expose the post electrodes 220 and stud bumps 232 (see FIG. 43). However, as was explained with reference to FIGS. 25 to 31, the exposure of the post electrodes 220 and stud bumps 232 can instead be achieved by using a laser or the like to form holes. In such a case, if hole-opening is also carried out with respect to portions of the internal board wiring pattern 290, connection between the internal board wiring pattern 290 and the other wiring patterns and the like can be readily achieved.

The present invention is in no way limited to the aforementioned embodiments, but rather various modifications are possible within the scope of the invention as recited in the claims, and naturally these modifications are included within the scope of the invention.

In the module with embedded semiconductor IC 100 shown in FIG. 1, for example, the lower board wiring patterns 110 and 111 are embedded in the resin layer 140. However, the lower board wiring patterns 110 and 111 can instead be formed on the surface of the resin layer 140 by, in the pressing step shown in FIG. 14, using the transfer board 206 shown in FIG. 39 in place of the transfer board 101, and then conducting the steps shown in FIGS. 44 to 49.

On the other hand, in the case of the module with embedded semiconductor IC 200 shown in FIG. 32, the lower board wiring patterns 210 and 211 can be embedded in the resin layer 240 by, in the pressing step shown in FIG. 39, using the transfer board 101 shown in FIGS. 10 and 14 instead of the transfer board 206, and then conducting the steps shown in FIGS. 19 to 24.

Moreover, it is possible to form both the lower board wiring pattern 110 embedded in the resin layer 140 (240) and the lower board wiring patterns 210 and 211 formed on the surface of the resin layer 140 (240). In this case, in order to establish insulation, a layer like the resin layer 150 (250) needs to be interposed between embedded lower board wiring pattern 110 and the lower board wiring patterns 210 and 211 formed on the surface.

In either embodiment, the transfer boards are in the end peeled off. However, it is possible, for example, to use as one of the transfer boards a multilayer substrate that is provided with multiple sets of internal wiring and is not peeled off after pressing but left intact to be used as part of the module with embedded semiconductor IC. For instance, in the pressing step shown in FIG. 39, a multilayer substrate formed with the post electrodes 220 can be used in place of the transfer board 206 formed with the post electrodes 220 and this multilayer substrate can be left intact (not peeled off) for use as part of the module with embedded semiconductor IC.

Further, in either embodiment, the transfer board 106 (201) is positioned with respect to the transfer board 101 (206) by inserting the post electrodes 120 (220) into the locating holes 106b (201b) formed in the transfer board 106 (201) (FIGS. 14 and 39). However, the positioning need not rely on the insertion of the post electrodes into the locating holes. For instance, it is possible to set the height of the post electrodes approximately equal to the thickness of the prepreg (140a, 240a) and position the post electrodes via the locating holes by use of image recognition. In this case, accurate positioning can be achieved without inserting the post electrodes into the locating holes. Even in the case of inserting the post electrodes into the locating holes, concurrent use of positioning by means of image recognition not only enables precise positioning even if the diameter of the locating holes is set considerably larger than the diameter of the post electrodes but also enhances working efficiency.

In the module with embedded semiconductor IC 100 shown in FIG. 1, the back surface 130b and peripheral surface 130c of the semiconductor IC 130 are totally in contact with the resin layer 140, and the main surface 130a of the semiconductor IC 130 is totally in contact with the resin layer 150. In the case where the resin layer 140 and resin layer 150 are made of different materials, however, it suffices for at least part of the resin layer 140 to be in contact with the back surface 130b and peripheral surface 130c of the semiconductor IC 130 and for the resin layer 150 to be in contact with at least the stud bumps 132. The same is true of the module with embedded semiconductor IC 200 shown in FIG. 32. Therefore, it is acceptable for the interface between the resin layer 140 and resin layer 150 to be located below the main surface 130a of the semiconductor IC 130, as shown in FIG. 50, or for the interface between the resin layer 140 and resin layer 150 to be located above the main surface 130a of the semiconductor IC 130, as shown in FIG. 51.

Figure 50:
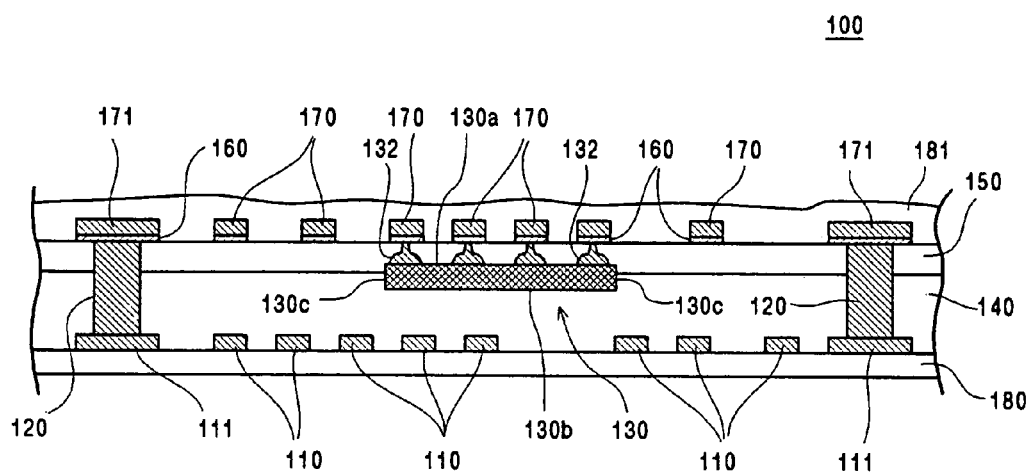
FIG. 50 is a schematic sectional view showing an example in which the interface between the resin layer 140 and resin layer 150 is located below the main surface 130a of the semiconductor IC 130.
Figure 51:
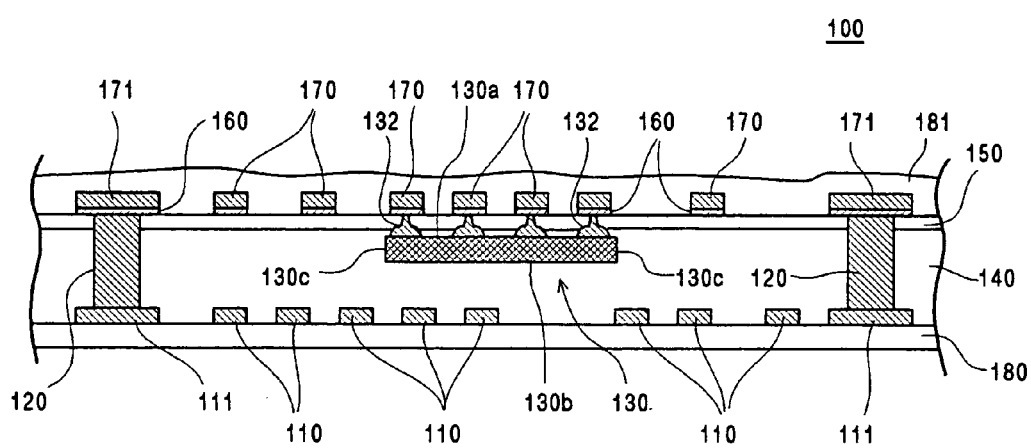
FIG. 51 is a schematic sectional view showing an example in which the interface between the resin layer 140 and resin layer 150 is located above the main surface 130a of the semiconductor IC 130.

It is worth noting, however, that the configuration shown in FIG. 50 increases the area of contact between the semiconductor IC 130 and resin layer 150, with the result that mechanical protection with respect to the semiconductor IC 130 is somewhat lower than in the configurations shown in FIGS. 1 and 32 (configurations in which the interface between the resin layer 140 and resin layer 150 coincides with the main surface 130a of the semiconductor IC 130). On the other hand, the configuration shown in FIG. 51 brings the stud bumps 132 into partial contact with the resin layer 140, with the result that the electrical properties of the signals handled by the semiconductor IC 130 become somewhat inferior to those in the case of the configuration shown in FIGS. 1 and 32.

As explained in the foregoing, the present invention can provide a module with embedded semiconductor IC that utilizes a semiconductor IC with a very narrow electrode pitch. In addition, the present invention enables simultaneous achievement of both good semiconductor IC physical protection and excellent electrical properties.

What is claimed is:

1. A multilayered module including at least one interconnecting wiring board, one discrete passive circuit element and one integrated circuit, comprising:
    a first resin layer;
    a second resin layer in contact with the first resin layer;
    a first circuit board wiring pattern formed on the first resin layer side;
    a second circuit board wiring pattern formed on a side of the second resin layer that is opposite the first resin layer;
    post electrodes embedded in at least the first and second resin layers; and
    a semiconductor IC mounted as embedded between the first resin layer and the second resin layer such that at least part of the peripheral surface of the semiconductor IC is in contact with the first resin layer,
    the semiconductor IC having bumps which are positioned with respect to the post electrodes so as to enable a narrow electrode pitch of the semiconductor IC, wherein a material forming the second resin layer has a higher Q value than a material forming the first resin layer.

2. The module as claimed in claim 1, wherein said semiconductor IC is reduced in thickness.

3. The module as claimed in claim 1, wherein the post electrodes being electrically connected at their one ends to the first circuit board wiring pattern, and the post electrodes being electrically connected at their other ends to the second circuit board wiring pattern.

4. The module as claimed in claim 3, further comprising a third circuit board wiring pattern formed to be embedded between the first resin layer and the second resin layer.

5. The module as claimed in claim 1, wherein the electrode pitch of the semiconductor IC is equal to or less than 100 μm.

6. The module as claimed in claim 1, wherein said first resin layer is in contact with, among surfaces of the semiconductor IC, at least a part of opposite surface to a surface provided with the bumps and at least a part of peripheral surface,
    the second resin layer being in contact with at least a part of bumps,
    the first resin layer and the second resin layer being formed of different materials.

7. The module as claimed in claim 6, wherein the material forming the second resin layer has a lower dielectric constant than the material forming the first resin layer.

8. The module as claimed in claim 6, wherein a mechanical strength of the material forming the first resin layer is higher than that of the material forming the second resin layer.

9. The module as claimed in claim 6, wherein a water absorption property of the material forming the first resin layer is lower than that of the material forming the second resin layer.

10. The module as claimed in claim 6, wherein an adhesive property with respect to the semiconductor IC of the material forming the first resin layer is higher than that of the material forming the second resin layer.

11. The module as claimed in claim 1, wherein the bumps of the integrated circuit are connected to at least a portion of the second circuit board wiring pattern.

12. A multilayered module with one or more interconnecting wiring board, comprising:
    a first circuit board wiring pattern;
    an integrated circuit having bumps formed on its main surface;
    a first resin layer formed in contact with the first circuit board wiring pattern and in contact with a back surface and at least part of a peripheral surface of the integrated circuit;
    a second resin layer formed in at least partial contact with at least side surfaces of the bumps;
    post electrodes embedded in at least the first resin layer and the second resin layer; and
    a second circuit board wiring pattern in contact with the second resin layer, wherein the first resin layer and the second resin layer are formed of different materials, wherein a material forming the second resin layer has a higher Q value than a material forming the first resin layer.

13. The module as claimed in claim 12, wherein the bumps of the integrated circuit are connected to at least a portion of the second circuit board wiring pattern.

14. The module as claimed in claim 12, further comprising:
    at least one discrete passive circuit element.

15. The module as claimed in claim 12, wherein the first resin layer includes a material selected from the group consisting of any or epoxy resin, phenol resin, and benzoxazine resin, impregnated with aramid fiber, glass cloth, or non-woven fabric.

16. The module as claimed in claim 12, wherein a mechanical strength of the material forming the first resin layer is higher than that of the material forming the second resin layer.

17. The module as claimed in claim 12, wherein a water absorption property of the material forming the first resin layer is lower than that of the material forming the second resin layer.

18. The module as claimed in claim 12, wherein an adhesive property with respect to the integrated circuit of the material forming the first resin layer is higher than that of the material forming the second resin layer.

19. The module as claimed in claim 12, wherein substantially all of the back surface of the integrated circuit is in contact with the first resin layer, and substantially all of the main surface of the integrated circuit is in contact with the second resin layer.

20. The module as claimed in claim 12, wherein substantially all of the peripheral surface of the integrated circuit is in contact with the first resin layer.

21. The module as claimed in claim 12, wherein said integrated circuit is reduced in thickness.

22. A multilayered module with one or more interconnecting wiring board, comprising:
    a first circuit board wiring pattern;
    an integrated circuit having bumps formed on its main surface;
    a first resin layer formed in contact with the first circuit board wiring pattern and in contact with a back surface and at least part of a peripheral surface of the integrated circuit;
    a second resin layer formed in at least partial contact with at least side surfaces of the bumps; and
    a second circuit board wiring pattern in contact with the second resin layer, wherein the first resin layer and the second resin layer are formed of different materials, wherein a material forming the second resin layer has a higher Q value than a material forming the first resin layer, wherein the second resin layer includes a material typically used to fabricate printed circuit boards so as to include aramid fiber, glass cloth, or non-woven fabric.

23. The module as claimed in claim 22, wherein a water absorption property of the material forming the first resin layer is lower than that of the material forming the second resin layer.

24. The module as claimed in claim 22, wherein substantially all of the back surface of the integrated circuit is in contact with the first resin layer, and substantially all of the main surface of the integrated circuit is in contact with the second resin layer.

25. The module as claimed in claim 22, wherein substantially all of the peripheral surface of the integrated circuit is in contact with the first resin layer.

* * * * *

UNITED STATES PATENT AND TRADEMARK OFFICE
CERTIFICATE OF CORRECTION

| | | |
|---|---|---|
| PATENT NO. | : 7,547,975 B2 | Page 1 of 1 |
| APPLICATION NO. | : 10/900458 | |
| DATED | : June 16, 2009 | |
| INVENTOR(S) | : Minoru Takaya et al. | |

It is certified that error appears in the above-identified patent and that said Letters Patent is hereby corrected as shown below:

Page 2, Column 2, under the header OTHER PUBLICATIONS: insert --European Search Report from the European Patent Office, dated August 9, 2006-- after "Dibble E. P., et al: "Considerations for Flip Chip," Advance Packaging, IHS Publishing Group, US, vol. 6, No. 3, May 1997, pp. 28-30, XP000694608, ISSN: 1065-0555."

Signed and Sealed this

Twenty-sixth Day of October, 2010

David J. Kappos
*Director of the United States Patent and Trademark Office*